(12) United States Patent
Wang et al.

(10) Patent No.: US 12,255,624 B2
(45) Date of Patent: Mar. 18, 2025

(54) BULK ACOUSTIC WAVE RESONATOR HAVING MULTIPLE RESONANT FREQUENCIES

(71) Applicant: Skyworks Solutions, Inc., Irvine, CA (US)

(72) Inventors: Yiliu Wang, Irvine, CA (US); Jiansong Liu, Fremont, CA (US); Tomoya Komatsu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 481 days.

(21) Appl. No.: 17/455,645

(22) Filed: Nov. 18, 2021

(65) Prior Publication Data

US 2022/0200571 A1   Jun. 23, 2022

Related U.S. Application Data

(60) Provisional application No. 63/130,209, filed on Dec. 23, 2020, provisional application No. 63/130,237, filed on Dec. 23, 2020.

(51) Int. Cl.
*H03H 9/56* (2006.01)
*H03H 9/17* (2006.01)
*H03H 9/205* (2006.01)
*H03H 9/54* (2006.01)

(52) U.S. Cl.
CPC ............ *H03H 9/568* (2013.01); *H03H 9/173* (2013.01); *H03H 9/175* (2013.01); *H03H 9/205* (2013.01); *H03H 9/547* (2013.01); *H03H 9/564* (2013.01)

(58) Field of Classification Search
CPC ........ H03H 9/568; H03H 9/173; H03H 9/175; H03H 9/205; H03H 9/547; H03H 9/564
USPC ......................................... 333/133, 187, 188
See application file for complete search history.

(56) References Cited

U.S. PATENT DOCUMENTS

| | | | |
|---|---|---|---|
| 6,518,860 B2 | 2/2003 | Ella et al. | |
| 6,927,651 B2 | 8/2005 | Larson, III et al. | |
| 2006/0151203 A1* | 7/2006 | Krueger | H03H 9/1071 29/841 |
| 2011/0298564 A1* | 12/2011 | Iwashita | H03H 9/173 333/187 |
| 2013/0083044 A1 | 4/2013 | Zuo et al. | |
| 2018/0076793 A1 | 3/2018 | Khlat et al. | |
| 2020/0358424 A1 | 11/2020 | Kaneda et al. | |
| 2022/0200572 A1 | 6/2022 | Wang et al. | |

OTHER PUBLICATIONS

Ivira, et al., "Modeling for Temperature Compensation and Temperature Characterizations of BAW Resonators at GHz Frequencies", IEEE Transactions on Ultrasonics, Ferroelectrics, and Frequency Control, vol. 55(2):421-430, Feb. 2008.

(Continued)

*Primary Examiner* — Jorge L Salazar, Jr.
(74) *Attorney, Agent, or Firm* — Knobbe, Martens, Olson & Bear, LLP

(57) ABSTRACT

Aspects of this disclosure relate to an acoustic wave filter that includes a shunt a bulk acoustic wave resonator having a plurality of resonant frequencies that impact a passband of the acoustic wave filter. Related bulk acoustic wave resonators, radio frequency modules, wireless communication devices, and methods of filtering radio frequency signals are disclosed.

20 Claims, 17 Drawing Sheets

(56) References Cited

OTHER PUBLICATIONS

Reinhardt, et al., "Multiple Frequency Solidly Mounted BAW Filters", May 2011.
Zou, et al., "Dual-mode thin film bulk acoustic wave resonator and filter", Journal of Applied Physics, vol. 128, 124503 (2020), published online Nov. 19, 2020.

* cited by examiner

BULK ACOUSTIC WAVE RESONATOR HAVING MULTIPLE RESONANT FREQUENCIES

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/130,209, filed Dec. 23, 2020 and titled "BULK ACOUSTIC WAVE RESONATOR HAVING MULTIPLE RESONANT FREQUENCIES," the disclosure of which is hereby incorporated by reference in its entirety and for all purposes. This application claims the benefit of priority of U.S. Provisional Application No. 63/130,237, filed Dec. 23, 2020 and titled "BULK ACOUSTIC WAVE RESONATOR HAVING MULTIPLE ANTI-RESONANT FREQUENCIES," the disclosure of which is hereby incorporated by reference in its entirety and for all purposes.

BACKGROUND

Technical Field

Embodiments of this disclosure relate to bulk acoustic wave resonators with two or more resonances, such as two or more resonant frequencies and/or two or more anti-resonant frequencies.

Description of Related Technology

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. Achieving strong out of band rejection for an acoustic wave band pass filter with a relatively small number of acoustic wave resonators can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter configured to filter a radio frequency signal. The acoustic wave filter includes a plurality of shunt acoustic wave resonators and a plurality of series acoustic wave resonators together configured to filter a radio frequency signal. The plurality of shunt acoustic wave resonators including a bulk acoustic wave resonator. The bulk acoustic wave resonator has at least a first resonant frequency and a second resonant frequency. The second resonant frequency is different than the first resonant frequency. The first resonant frequency and the second resonant frequency both impact a passband of the acoustic wave filter.

The second resonant frequency can be in a range from 0.9 times the first resonant frequency to 1.1 times the first resonant frequency. The acoustic wave filter can be a band pass filter, and the second resonant frequency is between the first resonant frequency and an edge of the passband. A difference between the first resonant frequency and the second resonant frequency can be at least 1 megahertz.

The bulk acoustic wave resonator can have a first region corresponding to the first resonant frequency and a second region corresponding to the second resonant frequency. The second region can surround the first region in plan view. The bulk acoustic wave resonator can have more mass loading in the first region than in the second region. Alternatively, the bulk acoustic wave resonator can have more mass loading in the second region than in the first region. The bulk acoustic wave resonator can have a taller stack in the second region than in the first region. Alternatively, the bulk acoustic wave resonator can have a taller stack in the first region than in the second region. The first region can include a central part of an active region of the bulk acoustic wave resonator.

The bulk acoustic wave resonator can have a third resonant frequency.

The bulk acoustic wave resonator can include a single piezoelectric layer.

The bulk acoustic wave resonator can have a single anti-resonant frequency that impacts the passband.

The bulk acoustic wave resonator can be a film bulk acoustic wave resonator. The bulk acoustic wave resonator can be a solidly mounted resonator.

The plurality of shunt acoustic wave resonators can include a second bulk acoustic wave resonator having a plurality of resonant frequencies. The plurality of series acoustic wave resonators can include a series bulk acoustic wave resonator having a plurality of anti-resonant frequencies.

Another aspect of this disclosure is a radio frequency module that includes an acoustic wave filter and a radio frequency circuit element coupled to the acoustic wave filter. The acoustic wave filter includes a shunt bulk acoustic wave resonator having at least a first resonant frequency and a second resonant frequency. The second resonant frequency is different than the first resonant frequency. The acoustic wave filter has a passband. The first resonant frequency and the second resonant frequency both impact the passband. The acoustic wave filter and the radio frequency circuit element are enclosed within a common package.

The radio frequency circuit element can be a radio frequency amplifier arranged to amplify a radio frequency signal. The radio frequency circuit element can be a switch configured to selectively couple the acoustic wave filter to an antenna port of the radio frequency module.

Another aspect of this disclosure is an acoustic wave filter configured to filter a radio frequency signal. The acoustic wave filter includes a plurality of series acoustic wave resonators and a plurality of shunt acoustic wave resonators together arranged to filter a radio frequency signal. The plurality of shunt acoustic wave resonators include a bulk acoustic wave resonator. The bulk acoustic wave resonator has at least a first resonant frequency and a second resonant frequency. The second resonant frequency is different than the first resonant frequency. The second resonant frequency is in a range from 0.9 times the first resonant frequency to 1.1 times the first resonant frequency.

The bulk acoustic wave resonator can have a first region corresponding to the first resonant frequency and a second region corresponding to the second resonant frequency. The second region can surround the first region in plan view. The first region can include a central part of an active region of the bulk acoustic wave resonator. The bulk acoustic wave resonator can have more mass loading in the first region than in the second region. Alternatively, the bulk acoustic wave resonator can have more mass loading in the second region than in the first region. The bulk acoustic wave resonator can have a taller stack in the first region than in the second region. Alternatively, the bulk acoustic wave resonator can have a taller stack in the second region than in the first region.

The bulk acoustic wave resonator can have a third resonant frequency.

The bulk acoustic wave resonator can include a single piezoelectric layer.

The acoustic wave filter can be a band pass filter having a pass band, and the first resonant frequency and the second resonant frequency can both impact the passband.

A difference between the first resonant frequency and the second resonant frequency can be at least 1 megahertz.

The bulk acoustic wave resonator can be a film bulk acoustic wave resonator. The bulk acoustic wave resonator can be a solidly mounted resonator.

The plurality of shunt acoustic wave resonators can include a second bulk acoustic wave resonator having a plurality of resonant frequencies.

The plurality of series acoustic wave resonators can include a series bulk acoustic wave resonator having a plurality of anti-resonant frequencies.

Another aspect of this disclosure is a bulk acoustic wave resonator that includes a first electrode, a second electrode, and a piezoelectric layer positioned between the first electrode and the second electrode. The bulk acoustic wave resonator has at least a first resonant frequency corresponding to a first region and a second resonant frequency corresponding to a second region. The bulk acoustic wave resonator has different mass loading in the first region than in the second region, the second resonant frequency being different than the first resonant frequency. The second resonant frequency is in a range from 0.9 times the first resonant frequency to 1.1 times the first resonant frequency.

The second region can surround the first region in plan view. The first region can include a central part of an active region of the bulk acoustic wave resonator.

The bulk acoustic wave resonator can have a taller stack in the first region than in the second region.

The bulk acoustic wave resonator can have a third resonant frequency corresponding to a third region.

The bulk acoustic wave resonator can include a single piezoelectric layer.

A difference between the first resonant frequency and the second resonant frequency can be at least 1 megahertz.

The bulk acoustic wave resonator can be a film bulk acoustic wave resonator. The bulk acoustic wave resonator can be a solidly mounted resonator.

Another aspect of this disclosure is an acoustic wave filter that includes a plurality of series acoustic wave resonators and a plurality of shunt acoustic wave resonators together configured to filter a radio frequency signal. The plurality of series acoustic wave resonators include a bulk acoustic wave resonator having at least a first anti resonant frequency and a second anti-resonant frequency that is different than the first anti-resonant frequency.

The acoustic wave filter can be a band pass filter having a passband. The first anti-resonant frequency and the second anti resonant frequency can both impact the passband.

The second anti-resonant frequency can be in a range from 0.9 times the first anti-resonant frequency to 1.1 times the first anti resonant frequency. A difference between the first anti resonant frequency and the second anti-resonant frequency can be at least 1 megahertz. The acoustic wave filter can be a band pass filter having a passband, and the second anti-resonant frequency can be between the first anti resonant frequency and an edge of the passband.

A first shunt resonator of the plurality of shunt acoustic wave resonators can have a plurality of resonant frequencies. The first shunt resonator can be a bulk acoustic wave resonator.

The bulk acoustic wave resonator can have a first region corresponding to the first anti-resonant frequency and a second region corresponding to the second anti-resonant frequency. The bulk acoustic wave resonator can have a different piezoelectric layer thickness in the first region than in the second region. The first region can surround the second region in plan view. Alternatively, the second region can surround the first region in plan view.

The acoustic wave filter can be a band pass filter having a passband corresponding to a fifth generation New Radio operating band. The acoustic wave filter can be a band pass filter having a passband that includes a fifth generation New Radio operating band and a fourth generation Long Term Evolution operating band.

Another aspect of this disclosure is a radio frequency module that includes an acoustic wave filter and a radio frequency circuit element coupled to the acoustic wave filter. The acoustic wave filter includes a series bulk acoustic wave resonator having at least a first anti resonant frequency and a second anti-resonant frequency that is different than the first anti-resonant frequency. The acoustic wave filter has a passband, and the first anti-resonant frequency and the second anti-resonant frequency both impact the passband. The acoustic wave filter and the radio frequency circuit element are enclosed within a common package.

The radio frequency circuit element can be a radio frequency amplifier arranged to amplify a radio frequency signal. The radio frequency module can further include a switch configured to selectively couple a terminal of the acoustic wave filter to an antenna port of the radio frequency module.

The radio frequency circuit element can be a switch configured to selectively couple the acoustic wave filter to an antenna port of the radio frequency module.

Another aspect of this disclosure is a bulk acoustic wave resonator that includes a first electrode, a second electrode, and a piezoelectric layer positioned between the first electrode and the second electrode. The bulk acoustic wave resonator has at least a first anti-resonant frequency corresponding to a first region and a second anti-resonant frequency corresponding to a second region. The second anti-resonant frequency is different than the first anti-resonant frequency. The second anti-resonant frequency is in a range from 0.9 times the first anti-resonant frequency and 1.1 times the first anti-resonant frequency.

The second region can surround the first region in plan view. The first region can include a central part of an active region of the bulk acoustic wave resonator.

The piezoelectric layer can have a different thickness in the second region than in the first region.

The bulk acoustic wave resonator can have a third anti-resonant frequency corresponding to a third region.

A difference between the first anti-resonant frequency and the second anti-resonant frequency can be at least 1 megahertz.

The bulk acoustic wave resonator can be a film bulk acoustic wave resonator. The bulk acoustic wave resonator can be a solidly mounted resonator.

Another aspect of this disclosure is a radio frequency module that includes an acoustic wave filter in accordance with any suitable principles and advantages disclosed herein and a radio frequency circuit element coupled to the acoustic wave filter. The acoustic wave filter and the radio frequency circuit element are enclosed within a common package.

The radio frequency circuit element can be a radio frequency amplifier arranged to amplify a radio frequency signal. The radio frequency amplifier can be a low noise amplifier. The radio frequency amplifier can be a power amplifier. The radio frequency module can further include a switch configured to selectively couple a terminal of the acoustic wave filter to an antenna port of the radio frequency module. The radio frequency circuit element can be a switch configured to selectively couple the acoustic wave filter to an antenna port of the radio frequency module.

Another aspect of this disclosure is a wireless communication device that includes an acoustic wave filter in accordance with any suitable principles and advantages disclosed herein, an antenna operatively coupled to the acoustic wave filter, a radio frequency amplifier operatively coupled to the acoustic wave filter and configured to amplify a radio frequency signal, and a transceiver in communication with the radio frequency amplifier.

Another aspect of this disclosure is a method of filtering a radio frequency signal that includes: receiving a radio frequency signal at a port of an acoustic wave filter in accordance with any suitable principles and advantages disclosed herein; and filtering the radio frequency signal with the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/455,642, titled "BULK ACOUSTIC WAVE RESONATOR HAVING MULTIPLE ANTI-RESONANT FREQUENCIES," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
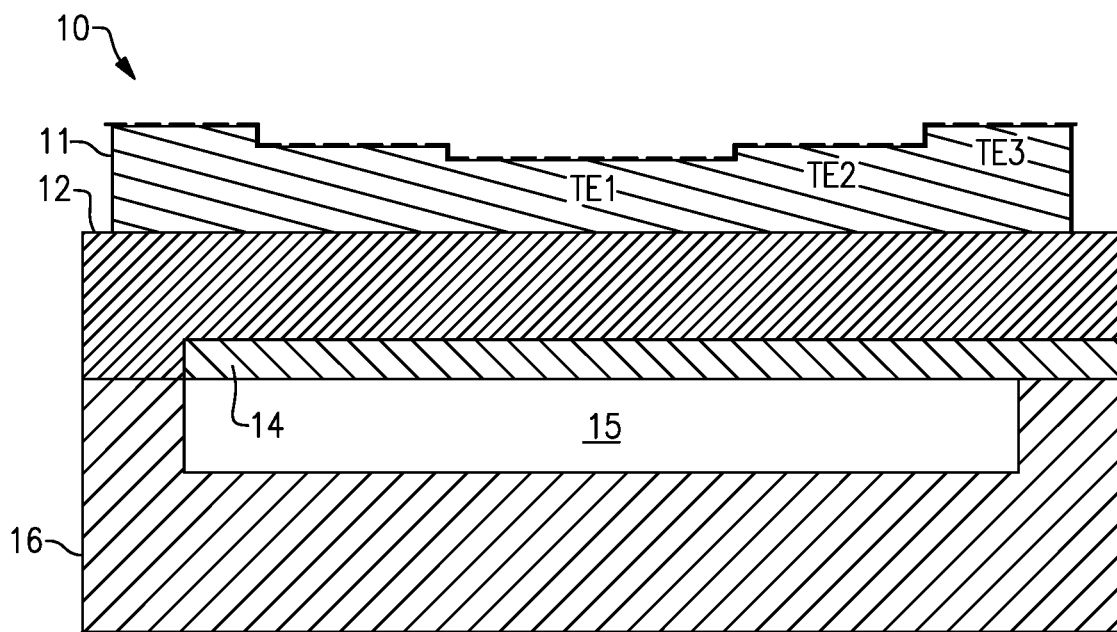
FIG. 1 is a cross sectional schematic diagram of a bulk acoustic wave resonator with a plurality of resonant frequencies according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Filters with rejection over a relatively wide frequency range are desired for certain radio frequency (RF) systems. Acoustic wave filters can include series acoustic wave resonators and shunt acoustic wave resonators. An anti-resonance frequency of a series acoustic wave resonator can be used for rejection in an acoustic wave band pass filter. The anti-resonance frequency of the series acoustic wave resonator can create an open to thereby create a notch in a frequency response. A resonant frequency of a shunt acoustic wave resonator can be used for rejection in an acoustic wave band pass filter. The resonant frequency of the shunt acoustic wave resonator can create a short to ground to thereby create a notch in a frequency response. The series acoustic wave resonator can have its highest conductance at the resonant frequency.

To achieve a relatively wide frequency range for rejection, an acoustic wave filter can include a plurality of shunt acoustic wave resonators each having a different resonant frequency. As an example, an acoustic wave filter can include 4 or 5 shunt acoustic wave resonators each having different respective resonant frequencies. With more shunt acoustic wave resonators having different resonant frequencies, the acoustic wave filter can achieve relatively higher rejection. At the same time, an acoustic wave filter with more acoustic wave resonators can consume additional area.

Aspects of this disclosure relate to a bulk acoustic wave resonator having at least two resonant frequencies. The bulk acoustic wave resonator can be arranged as a shunt resonator in an acoustic wave filter. Such a shunt resonator can achieve at least two notches and increase a frequency range for rejection of the acoustic wave filter. The acoustic wave filter can be a band pass filter with a passband. Two resonant frequencies of the bulk acoustic wave can both impact the passband. The two resonant frequencies can have frequencies within 10% of each other. One of the two resonant frequencies can be located between the other of the two resonant frequencies and a band edge of the passband of the acoustic wave filter in the frequency domain.

A bulk acoustic wave resonator with at least two resonant frequencies can include a first region corresponding to a first resonant frequency and a second region corresponding to a second resonant frequency. The first and second resonant frequencies are different from each other. The second resonant frequency can be in a range from 0.9 times the first resonant frequency to 1.1 times the first resonant frequency. The second region can surround the first region in plan view. The two resonant frequencies can result from different mass loading in the first and second regions. The bulk acoustic wave resonator can have stacks above the piezoelectric layer that are different heights over the first region and the second region.

A shunt acoustic wave resonator with multiple resonant frequencies can improve out of band rejection for a filter without significantly degrading the filter response in a passband. With a shunt acoustic wave resonator with multiple resonant frequencies, stringent rejection specifications can be met with fewer acoustic wave resonators than other solutions.

Aspects of this disclosure relate to a bulk acoustic wave resonator having at least two anti-resonant frequencies. The bulk acoustic wave resonator can be arranged as a series resonator in an acoustic wave filter. Such a series resonator can achieve at least two notches and increase a frequency range for rejection of the acoustic wave filter. The acoustic wave filter can be a band pass filter with a passband. Two anti-resonant frequencies of the bulk acoustic wave can both impact the passband. The two anti-resonant frequencies can have frequencies within 10% of each other. One of the two anti-resonant frequencies can be located between the other of the two anti-resonant frequencies and a band edge of the passband of the acoustic wave filter in the frequency domain. A BAW resonator with two anti-resonant frequencies can have different piezoelectric layer thicknesses in different regions of the BAW resonator.

Example BAW resonators with a plurality of resonances (e.g., resonant frequencies) will now be discussed. Any suitable principles and advantages of these BAW resonators can be implemented together with each other. Although embodiments disclosed herein may relate to a BAW resonator with two resonant frequencies, any suitable principles and advantages disclosed herein can be applied to a BAW resonator with three or more resonant frequencies. Any suitable principles and advantages disclosed herein can be applied to a BAW resonator with a plurality of anti-resonant frequencies.

FIG. 1 is a cross sectional diagram of a bulk acoustic wave resonator 10 with a plurality of resonant frequencies according to an embodiment. As illustrated, the bulk acoustic wave resonator 10 includes an upper layer stack 11, a piezoelectric layer 12, a lower electrode 14, an air cavity 15, and a support substrate 16.

The upper layer stack 11 provides different mass loading in different regions TE1, TE2, and TE3. The different mass loading in regions TE1 and TE2 creates two different resonant frequencies f1 and f2, respectively, for the bulk acoustic wave resonator 10. There is more mass loading in region TE2 than region TE1. Accordingly, a second resonant frequency f2 corresponding to region TE2 is lower than a first resonant frequency corresponding to region TE1. The second resonant frequency f2 can be at least 0.9 times the first resonant frequency f1 in certain applications. The second resonant frequency f2 can be at least 1 megahertz (MHz) different than the first resonant frequency f1 in a variety of applications. Both the first resonant frequency f1 and the second resonant frequency f2 can impact the passband of a band pass filter that includes the bulk acoustic wave resonator 10. The height of the upper layer stack 11 in the region TE2 extending above the piezoelectric layer 12 together with the width of the upper layer stack 11 in the region TE2 extending generally parallel to the piezoelectric layer 12 can impact the second resonant frequency f2.

Although different mass loading is provided in different regions of the bulk acoustic wave resonator 10 by the upper material stack 11 in FIG. 1, one or more other layers embedded in a piezoelectric layer and/or below a piezoelectric layer can alternatively or additional contribute to different mass loading in different regions of a bulk acoustic wave resonator.

The upper material stack 11 includes an upper electrode of the bulk acoustic wave resonator 10. The upper material stack 11 can also include one or more of a passivation layer, a portion of the piezoelectric layer, and/or any other suitable layers over the piezoelectric layer 12. The upper material stack 11 can include a raised frame structure in region TE3.

An active region or active domain of the BAW resonator 10 can be defined by a portion of a piezoelectric layer 12 that is in contact with both the lower electrode 14 and an upper electrode of the upper material stack 11 and overlaps an acoustic reflector, such as the air cavity 15 or a solid acoustic mirror. The active region corresponds to where voltage is applied on opposing sides of the piezoelectric layer over the acoustic reflector. The active region can be the acoustically active region of the BAW resonator 10. The BAW resonator 10 also includes a raised frame region TE3 with a raised frame structure in the active region. A main acoustically active region can be the central part of the active region that is free from the raised frame structure.

The piezoelectric layer 12 can be an aluminum nitride layer. The piezoelectric layer 12 can be any other suitable piezoelectric layer. The piezoelectric layer 12 can be doped with any suitable dopant in a variety of applications. For example, the piezoelectric layer 12 can be an aluminum nitride layer doped with scandium in certain applications. The lower electrode 14 can have a relatively high acoustic impedance. The lower electrode 14 can include molybdenum (Mo), tungsten (W), ruthenium (Ru), chromium (Cr), iridium (Ir), platinum (Pt), Ir/Pt, or any suitable alloy and/or combination thereof. Similarly, the upper electrode of the upper material stack 11 can have a relatively high acoustic impedance. The upper electrode can include Mo, W, Ru, Cr, Ir, Pt, Ir/Pt, or any suitable alloy and/or combination thereof. The lower electrode 14 and the upper electrode can be formed of the same material in certain instances. The piezoelectric layer 12 is positioned between the lower electrode 14 and the upper electrode of the upper material stack 11.

The air cavity 15 is an example of an acoustic reflector. The air cavity 15 is located between the support substrate 16 and the lower electrode 14. As illustrated, the air cavity 15 is etched into the support substrate 16. Alternatively, an air cavity can be located above a support substrate. The support substrate 16 can be a silicon substrate. The support substrate 16 can be any other suitable support substrate.

Figure 2A:
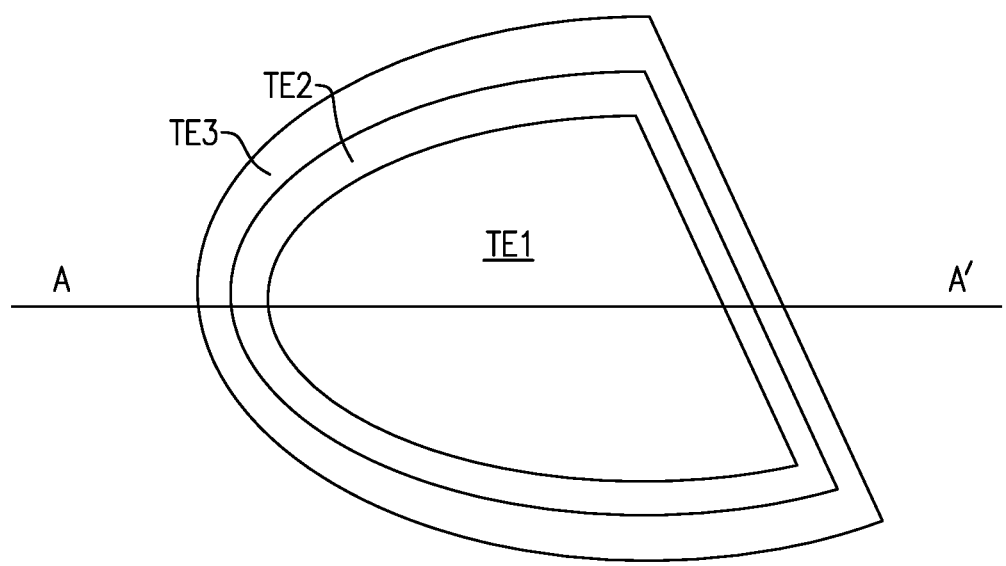
FIG. 2A is an example plan view of the bulk acoustic wave resonator of FIG. 1.
Figure 2B:
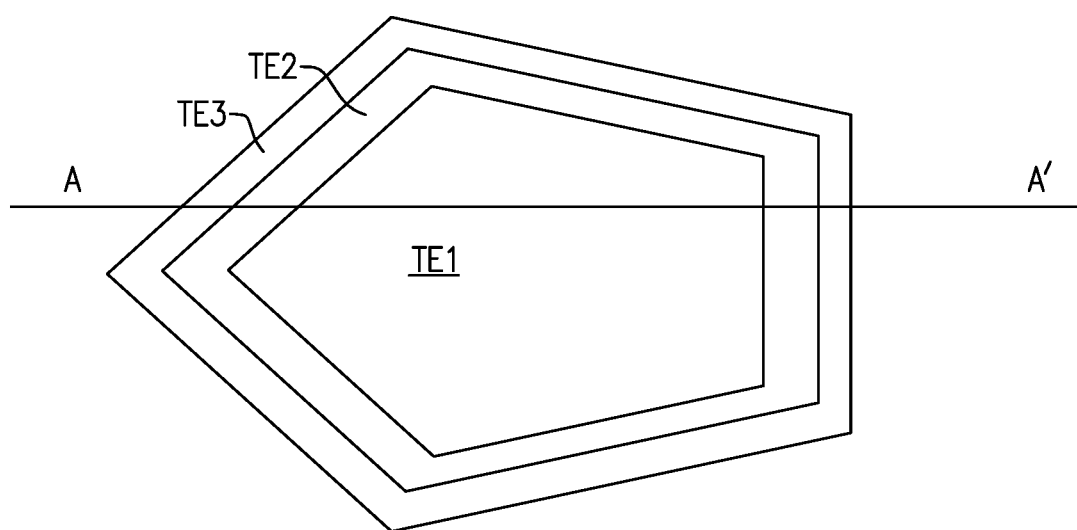
FIG. 2B is another example plan view of the bulk acoustic wave resonator of FIG. 1.

FIGS. 2A and 2B are example plan views of the BAW resonator 10 of FIG. 1. Any other BAW resonators disclosed herein can be implemented with the same or a similar shape to the BAW resonator 10 in plan view. The cross-sectional view of FIG. 1 is along the line from A to A' in FIGS. 2A and 2B. In FIGS. 2A and 2B, the regions TE1, TE2, and TE3 are more to scale in terms of area than in FIG. 1. These figures illustrate that the region TE1 can correspond be the majority of the area of the BAW resonator 10. FIG. 2A illustrates the BAW resonator 10 with a semi-elliptical shape in plan view. FIG. 2B illustrates the BAW resonator 10 with a pentagon shape in plan view. The pentagon shape can have curves sides in certain applications. In some other embodiments, a BAW resonator in accordance with any suitable principles and advantages disclosed herein can have any suitable shape in plan view, such as a quadrilateral shape, a quadrilateral shape with curved sides, a semi-circular shape, a circular shape, or ellipsoid shape.

Figure 3:
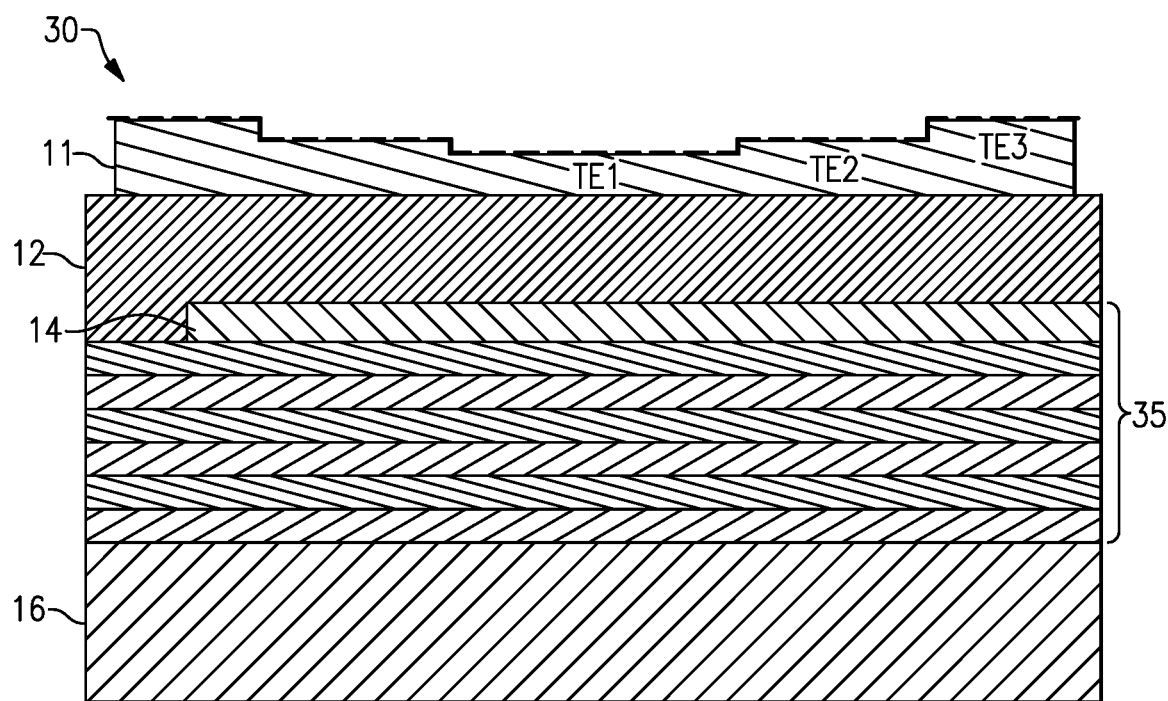
FIG. 3 is a cross sectional schematic diagram of a bulk acoustic wave resonator with a plurality of resonant frequencies according to an embodiment.

FIG. 3 is a cross sectional schematic diagram of a bulk acoustic wave resonator 30 with a plurality of resonant frequencies according to an embodiment. The bulk acoustic wave resonator 30 is like the bulk acoustic wave resonator 10 of FIG. 1, except that a solid acoustic mirror 35 is included in place of an air cavity 15. The solid acoustic mirror 35 is an acoustic Bragg reflector. The solid acoustic mirror 35 includes alternating low acoustic impedance and high acoustic impedance layers. As one example, the solid acoustic mirror 35 can include alternating silicon dioxide layers as low impedance layers and tungsten layers as high impedance layers. The bulk acoustic wave resonator 30 is an example of a BAW solidly mounted resonator (SMR). Any suitable principles and advantages of disclosed herein can be applied in BAW SMRs.

Figure 4:
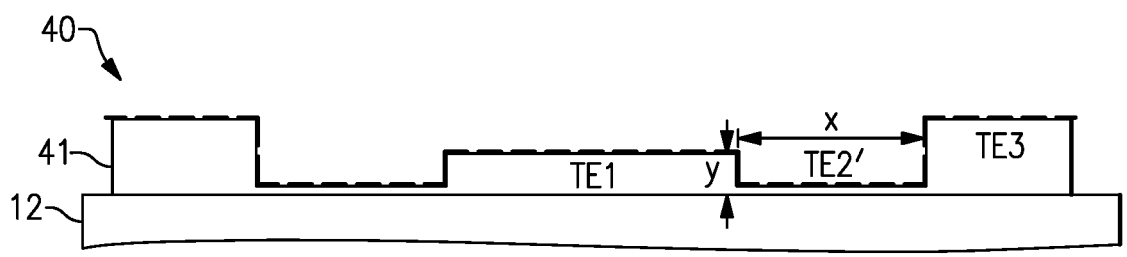
FIG. 4 is a cross sectional schematic diagram of a portion of a bulk acoustic wave resonator with a plurality of resonant frequencies according to an embodiment.

FIG. 4 is a cross sectional schematic diagram of a portion of a bulk acoustic wave resonator 40 with a plurality of resonant frequencies according to an embodiment. FIG. 4 illustrates an upper material stack 41 over a piezoelectric layer 12. The upper material stack 41 can include any suitable layers of the upper material stack 11 of FIG. 1. The upper material stack 41 is like the material stack 11 of FIG. 1, except that the upper material stack 41 is thinner in region TE2' than in region TE1. There is less mass loading in region TE2' than in region TE1. Accordingly, the bulk acoustic wave resonator 40 can have a first resonant frequency f1 corresponding to region TE1 that is lower than a second resonant frequency f2 corresponding to region TE2'. The height y and the width x can be selected to impact the resonant frequency t2. The height y and width can be selected such that the second resonant frequency f2 is 1.1 times the first resonant frequency f1 or less. The second frequency f2 can be at least 1 megahertz (MHz) different than the first resonant frequency f1. Both the first resonant frequency f1 and the second resonant frequency f2 can impact the passband of a band pass filter that includes the bulk acoustic wave resonator 40. The second resonant frequency f2 can be between the first resonant frequency f1 and a band edge (e.g., an upper band edge) of a band pass filter when the bulk acoustic wave resonator 40 is a shunt acoustic wave resonator in the band pass filter.

Figure 5A:
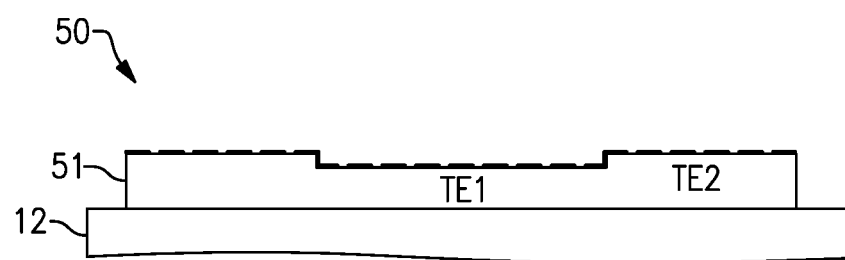
FIG. 5A is a cross sectional schematic diagram of a portion of a bulk acoustic wave resonator with a plurality of resonant frequencies according to another embodiment.

FIG. 5A is a cross sectional schematic diagram of a portion of a bulk acoustic wave resonator 50 with a plurality of resonant frequencies according to another embodiment. FIG. 5A illustrates an upper material stack 51 over a piezoelectric layer 12. The upper material stack 51 does not include a raised frame structure. In the bulk acoustic wave resonator 50, there is more mass loading in region TE2 than in region TE1. Accordingly, a second resonant frequency f2 associated with region TE2 is less than a first resonant frequency f1 associated with region TE1 in the bulk acoustic wave resonator 50. The second frequency f2 can be at least 1 MHz less than the first resonant frequency f1 in the bulk acoustic wave resonator 50. Both the first resonant frequency f1 and the second resonant frequency f2 can impact the passband of a band pass filter that includes the bulk acoustic wave resonator 50. The second resonant frequency f2 can be between the first resonant frequency f1 and a band edge (e.g., an upper band edge) of a band pass filter when the bulk acoustic wave resonator 50 is a shunt acoustic wave resonator in the band pass filter.

Figure 5B:
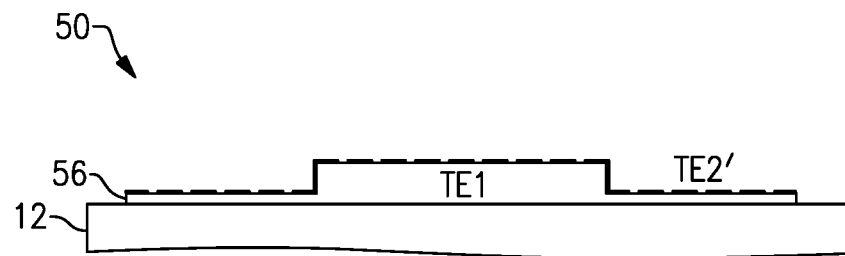
FIG. 5B is a cross sectional schematic diagram of a portion of a bulk acoustic wave resonator with a plurality of resonant frequencies according to another embodiment.

FIG. 5B is a cross sectional schematic diagram of a portion of a bulk acoustic wave resonator 55 with a plurality of resonant frequencies according to another embodiment. FIG. 5B illustrates an upper material stack 56 over a piezoelectric layer 12. The upper material stack 56 does not include a raised frame structure. In the bulk acoustic wave resonator 55, there is less mass loading in region TE2 than in region TE1. Accordingly, a second resonant frequency f2 associated with region TE2 is greater than a first resonant frequency f1 associated with region TE1 in the bulk acoustic wave resonator 55. The second frequency f2 can be at least 1 MHz greater than the first resonant frequency f1 in the bulk acoustic wave resonator 540. Both the first resonant frequency f1 and the second resonant frequency f2 can impact the passband of a band pass filter that includes the bulk acoustic wave resonator 55. The first resonant frequency f1 can be between the second resonant frequency f2 and a band edge (e.g., an upper band edge) of a band pass filter when the bulk acoustic wave resonator 55 is a shunt acoustic wave resonator in the band pass filter.

FIGS. 5A and 5B illustrate that any suitable principles and advantages disclosed herein can be implemented in BAW devices without a raised frame structure. The regions TE1 and TE2 can have any suitable area relationship relative to each other for a particular application. The combination of width, height, and layer stacks of each of the regions TE1 and TE2 can result in two different resonant frequencies that are within 10% of each other in BAW devices disclosed herein.

Figure 6A:
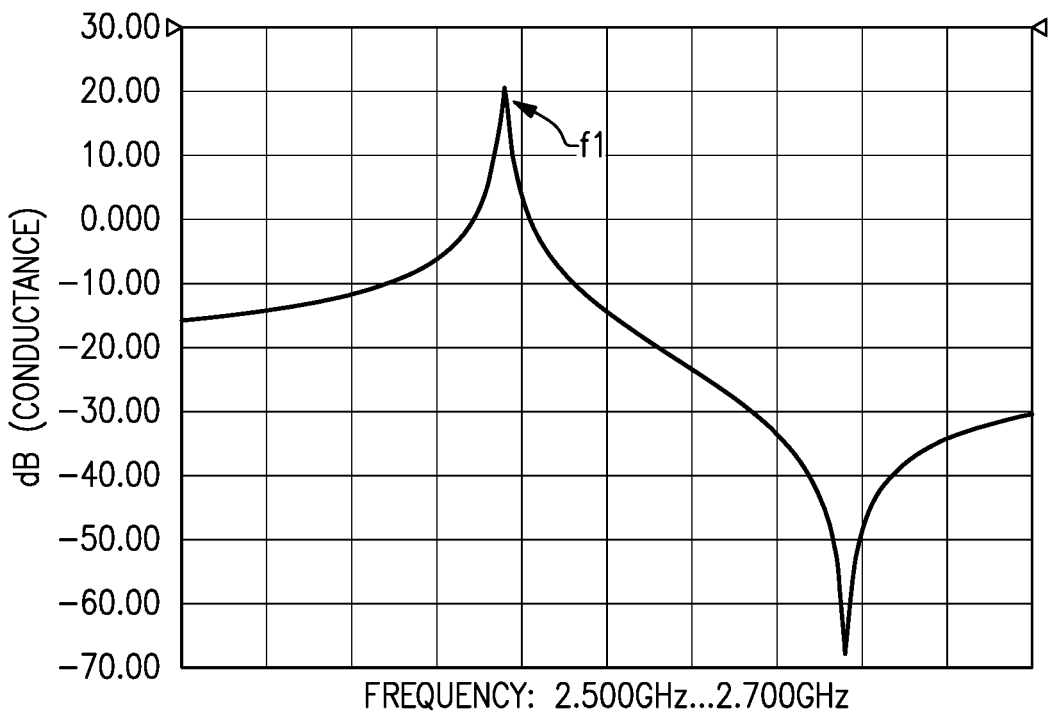
FIG. 6A is a graph of conductance for a bulk acoustic wave resonator with a single resonant frequency.

FIG. 6A is a graph of conductance for a bulk acoustic wave resonator with a single resonant frequency. As shown in FIG. 6A, the conductance graph has a peak at resonant frequency f1. In a band pass filter with a ladder topology, the resonant frequency f1 of a shunt resonator can be used for rejection. The resonant frequency f1 of the bulk acoustic wave resonator arranged as a shunt resonator can create a short to ground thereby creating a notch in the frequency response.

Figure 6B:
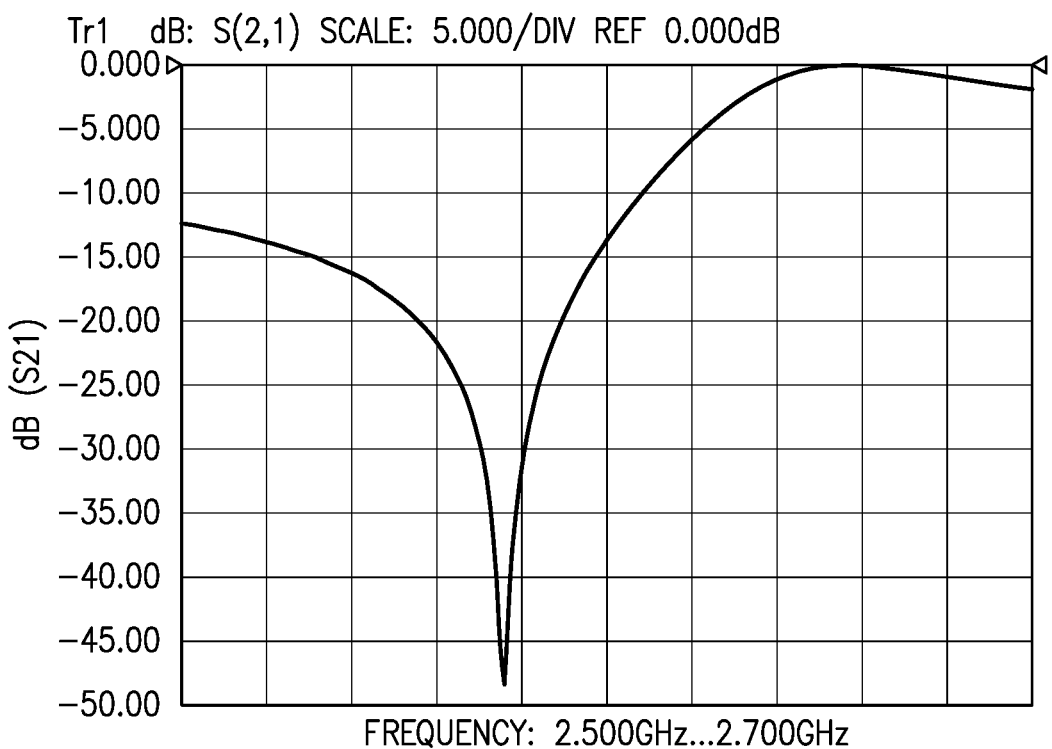
FIG. 6B is a graph of a frequency response for a bulk acoustic wave resonator with a single resonant frequency.

FIG. 6B is a graph of a frequency response for the bulk acoustic wave resonator corresponding to the graph of FIG. 6A. There is a notch in the frequency response aligned with the resonant frequency f1 of the shunt bulk acoustic wave resonator.

Figure 7A:
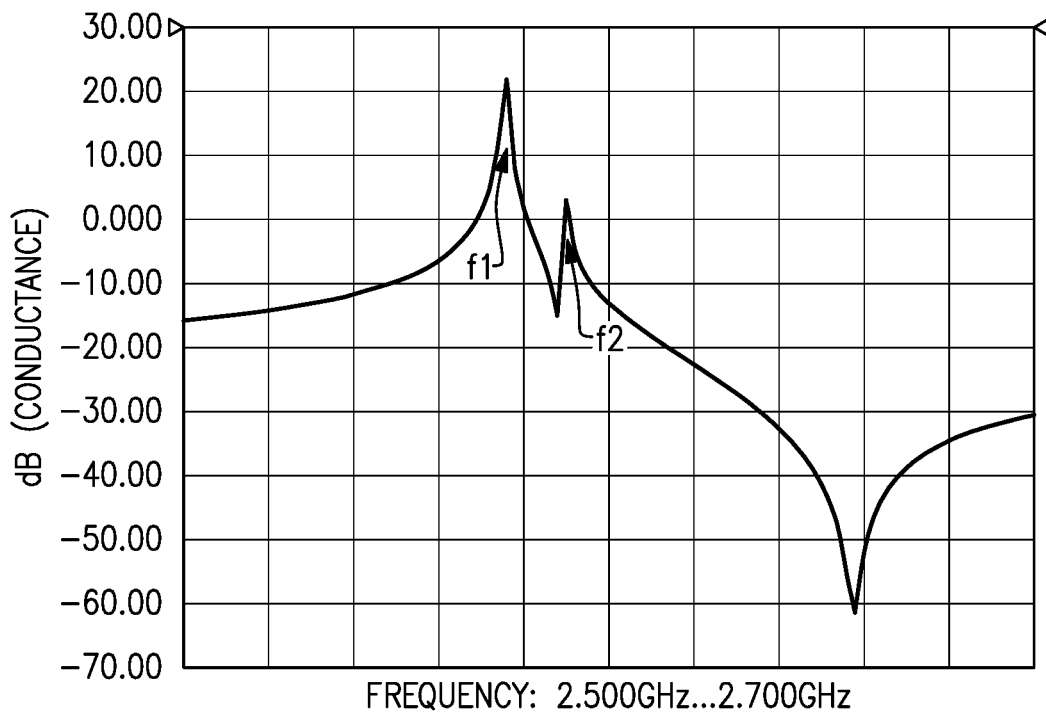
FIG. 7A is a graph of conductance for the bulk acoustic wave resonator of FIG. 4.

FIG. 7A is a graph of conductance for the bulk acoustic wave resonator of FIG. 4. As shown in FIG. 7A, the conductance graph has peaks at two frequencies f1 and f2. The frequencies f1 and f2 are resonant frequencies that correspond to the regions TE1 and TE2, respectively, of the bulk acoustic wave resonator 40 of FIG. 4. The first resonant frequency f1 is distinct from the second resonant frequency f2. In certain instances, the second resonant frequency f2 is at least 1 megahertz (MHz) above the first resonant frequency f1. In some applications, a difference between the second resonant frequency f2 and the first resonant frequency f1 is at least 5 MHz. The second resonant frequency f2 is greater than the first resonant frequency in the graph of FIG. 7A. The second resonant frequency f2 can be no more than 1.1 times the first resonant frequency f1 in certain embodiments. The second resonant frequency f2 can be between the first resonant frequency f1 and a band edge of a passband of an acoustic wave filter that includes the bulk acoustic wave resonator 40.

In certain applications, a BAW device can have a main mode resonant frequency associated with a main acoustically active region and a second resonant frequency associated with a recessed frame region. The second resonant frequency can be greater than the main mode resonant frequency, and a silicon dioxide thickness can be thinner in the recessed frame region than in the main acoustically active region. In such a BAW device, the two resonant frequencies and a single anti-resonant frequency that is associated with the main acoustically active region can impact a passband of a filter that includes the BAW device.

Figure 7B:
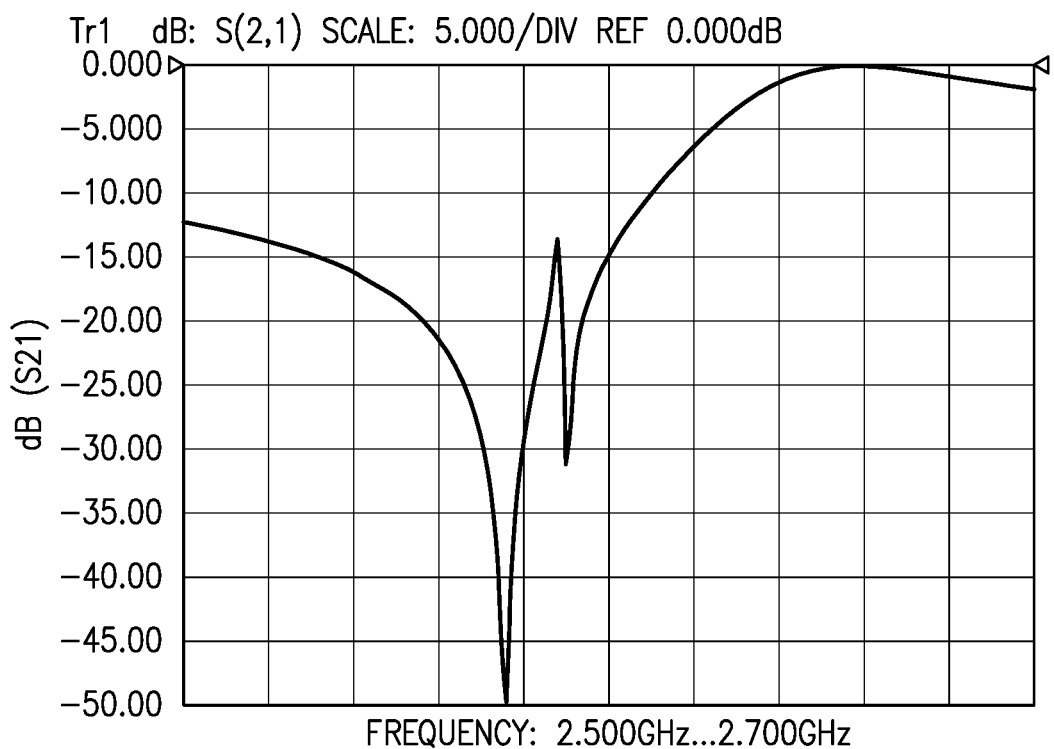
FIG. 7B is a graph of a frequency response for the bulk acoustic wave resonator of FIG. 4.

FIG. 7B is a graph of a frequency response for the bulk acoustic wave resonator 40 of FIG. 4. The bulk acoustic wave resonator 40 is arranged as a shunt resonator. The two notches in the frequency response shown in FIG. 7B are at the resonant frequencies f1 and f2 shown in FIG. 7A. The two notches can be referred to as rejection poles. The resonant frequencies f1 and f2 of the shunt bulk acoustic wave resonator 40 can both impact the passband of a band pass filter that includes a shunt bulk acoustic wave resonator 40. In contrast, a raised frame structure of a bulk acoustic wave resonator typically has a resonance at a frequency significantly higher than a passband of the band pass filter that includes the bulk acoustic wave resonator. The highest frequency shunt bulk acoustic wave resonator can have the largest contribution to edge steepness for a lower edge of a passband of a band pass filter.

Figure 8A:
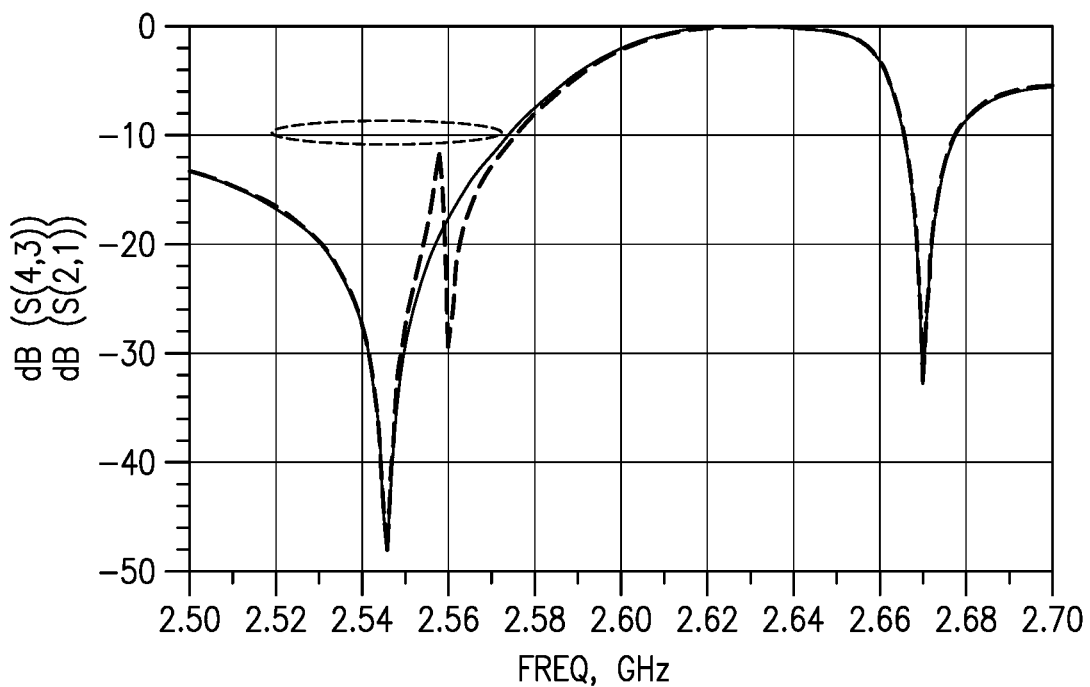
FIGS. 8A and 8B are graphs with simulation results of a frequency response for a ladder filter that includes one shunt bulk acoustic wave resonator with a plurality of resonant frequencies and a series bulk acoustic wave resonator.
Figure 8B:
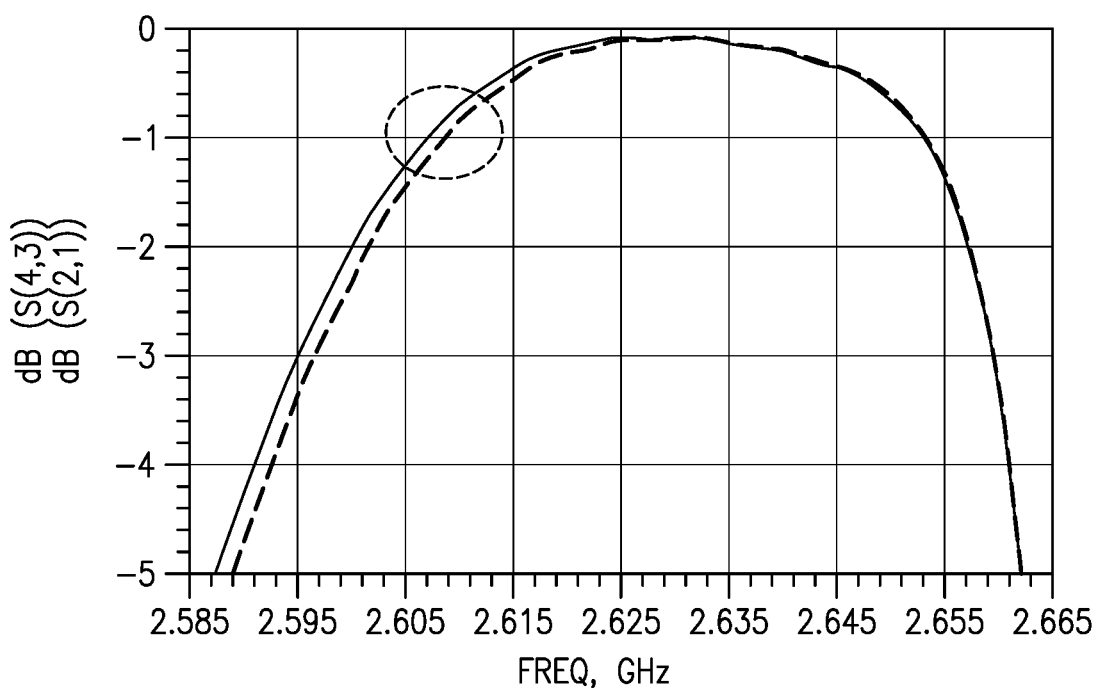

FIGS. 8A and 8B are graphs with simulation results of a frequency response for a ladder filter that includes one shunt bulk acoustic wave resonator with a plurality of resonant frequencies and a series bulk acoustic wave resonator. FIG. 8B shows a zoomed in portion of FIG. 8A. The graphs compare the ladder filter with one shunt BAW resonator with two resonant frequencies to a similar ladder filter where each BAW resonator has a single resonant frequency. The ladder filter with one shunt BAW resonator with two resonant frequencies can provide better transmit band rejection. There can be slight degradation in the filter response in the passband for the ladder filter with one shunt BAW resonator with two resonant frequencies. As illustrated, the slight degradation can be increased insertion loss in part of the passband. The slight degradation can be compensated for with more ladder stage(s) and/or optimization. FIGS. 8A and 8B indicate that a relatively wider frequency range of rejection can be obtained without adding other components (such as a resonator) with the ladder filter with a BAW resonator with two resonant frequencies.

Figure 9:
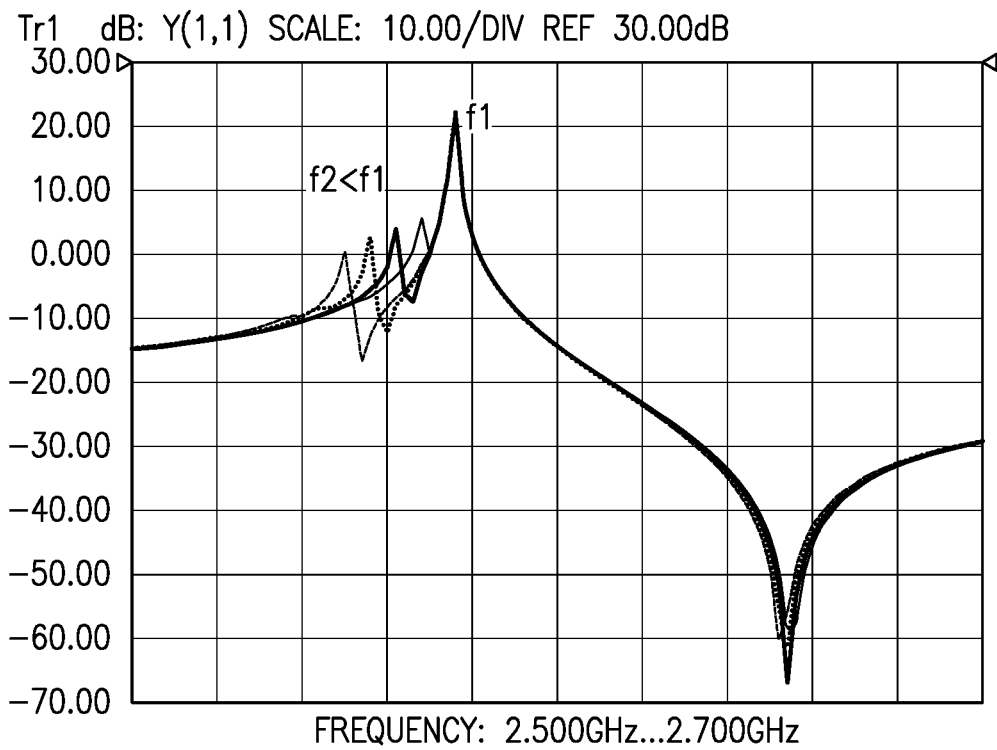
FIG. 9 is a graph related to tuning a second resonant frequency below a first resonant frequency for a bulk acoustic wave resonator having two resonant frequencies.

FIG. 9 is a graph related to tuning a second resonant frequency below a first resonant frequency for a bulk acoustic wave resonator having two resonant frequencies. In these simulations, the first resonant frequency f1 was fixed in the BAW resonator. FIG. 9 shows that by adjusting mass loading in region TE2 of the bulk acoustic wave resonator 10 of FIG. 1, the separation between resonant frequencies f1 and f2 can be adjusted. There is more mass loading in region TE2 than region TE1 in the bulk acoustic wave resonator 10 of FIG. 1. With less difference in mass loading relative to region TE1, the second resonant frequency f2 moves closer to the first resonant frequency f1 in the bulk acoustic wave resonator 10. With more mass loading in region TE2 and a bigger difference from mass loading in region TE1, the second resonant frequency f2 moves away from the first resonant frequency f1 in the bulk acoustic wave resonator 10. Accordingly, the difference between resonant frequencies f1 and f2 can be tuned by adjusting the difference in mass loading between regions TE1 and TE2 in the bulk acoustic wave resonator 10 of FIG. 1.

Figure 10:
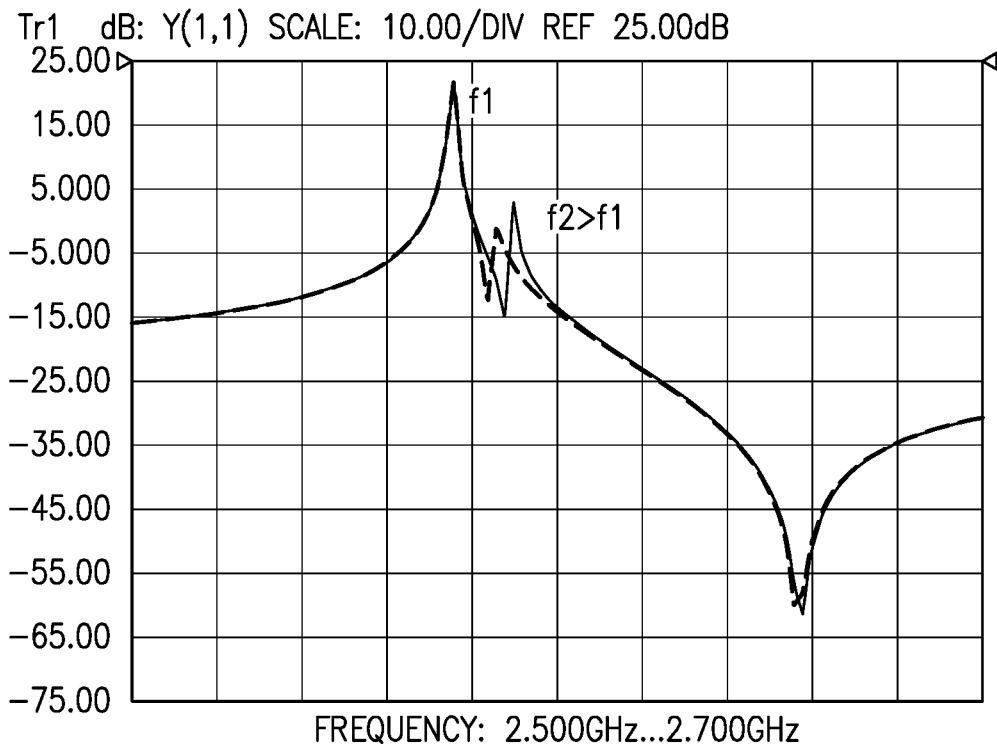
FIG. 10 is a graph related to tuning a second resonant frequency above a first resonant frequency for a bulk acoustic wave resonator having two resonant frequencies.

FIG. 10 is a graph related to tuning a second resonant frequency below a first resonant frequency for a bulk acoustic wave resonator having two resonant frequencies. In these simulations, the first resonant frequency f1 was fixed in the BAW resonator. FIG. 10 shows that by adjusting mass loading in region TE2 of the bulk acoustic wave resonator 40 of FIG. 4, the separation between resonant frequencies f1 and f2 can be adjusted. There is more mass loading in region TE1 than region TE2 in the bulk acoustic wave resonator 40 of FIG. 4. Increasing the mass loading in region TE2 can bring the resonant frequencies f1 and f2 closer to each other in the bulk acoustic wave device 40. Reducing the mass loading in region TE2 can bring the resonant frequencies f1 and f2 farther from each other in the bulk acoustic wave device 40. With mass loading in region TE2 closer to mass loading in region TE1, the second resonant frequency f2 moves closer to the first resonant frequency f1. With a bigger difference in mass loading between region TE2 and region TE1, the second resonant frequency f2 moves away from the first resonant frequency f1. Accordingly, the difference between resonant frequencies f1 and f2 can be tuned by adjusting the difference in mass loading between regions TE1 and TE2 in the bulk acoustic wave resonators disclosed herein.

Figure 11:
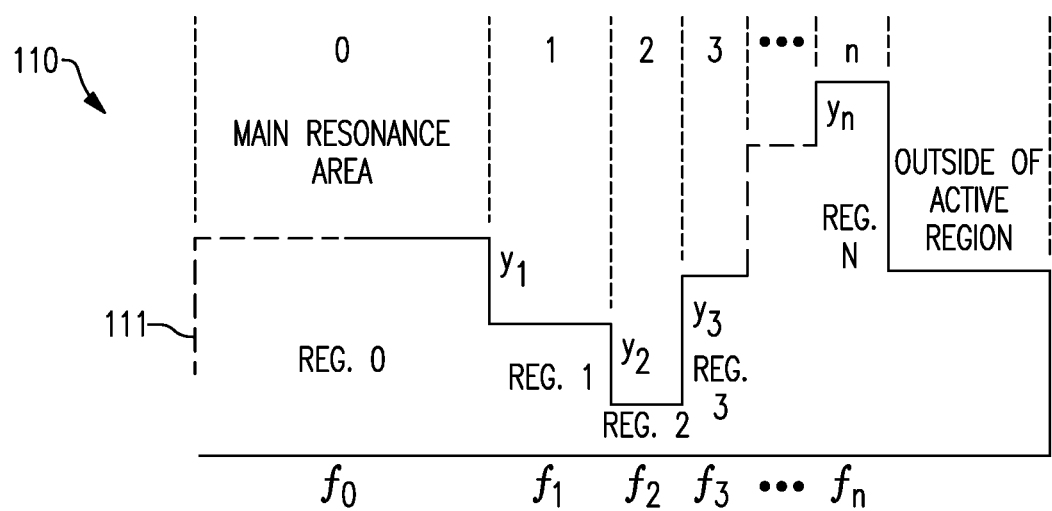
FIG. 11 is a schematic cross sectional diagram of portion of a bulk acoustic wave resonator having a plurality resonances according to an embodiment.

FIG. 11 is a schematic cross sectional diagram of portion of a bulk acoustic wave resonator 110 having a plurality resonances according to an embodiment. An upper material stack 111 of the bulk acoustic wave resonator 110 is illustrated in FIG. 11. The upper material stack 111 has different thicknesses and/or widths in Regions 0, 1, 2, 3, . . . , N. The different thicknesses and/or widths of the upper material stack 111 can create different resonances in the bulk acoustic wave resonator 110. In FIG. 11, the upper material stack 111 of half of the bulk acoustic wave resonator 110 in cross sectional view is shown. In cross sectional view, the bulk acoustic wave resonator 110 includes Regions 1, 2, 3, . . . , N on opposing sides of Region 0. Region 0 can be the majority of the area of the bulk acoustic wave resonator 110. The bulk acoustic wave resonator 110 can have any suitable shape in plan view, such as any suitable shape discussed above.

FIG. 11 illustrates that any suitable number of resonant frequencies can be created in the bulk acoustic wave resonator 110. Different mass loading over Regions 0, 1, 2, 3, . . . , N can result in different respective resonant frequencies. The resonant frequency of the main region can be fos. The mass loading in Regions 1, 2, 3, . . . , N can be selected such that the resonant frequency for each of the Regions 1, 2, 3, . . . , N is within +/−10% of fos, as represented by the following: $0.9*\text{fos} \leq \text{f1}s \ldots \text{fns} \leq 1.1*\text{fos}$. Each of the resonant frequencies f1s . . . fns of the respective Regions 1 . . . N can be either greater than or less than resonant frequency fos depending on mass loading. Mass loading can be adjusted by height and/or width of the upper material stack 111. Alternatively or additionally, mass loading can be adjusted by including different materials with different densities in different regions.

Different resonant frequencies can be based at least in part on one or more of different piezoelectric materials in different regions of a BAW resonator, different dopants and/or doping concentrations of the piezoelectric layer in different regions of a BAW resonator, or different c-axis orientations of piezoelectric material in different regions of a BAW resonator.

FIG. 11 illustrates that any suitable number of anti-resonant frequencies can be created in the bulk acoustic wave device 110. Different thickness of the piezoelectric layer in the upper material stack 111 in Regions 0, 1, 2, 3, . . . , N can result in different respective anti-resonant frequencies. The anti-resonant frequency of the main region can be fop. The piezoelectric layer thickness in Regions 1, 2, 3, . . . , N can be selected such that the anti-resonant frequency for each of the Regions 1, 2, 3, . . . , N is within +/−10% of fop, as represented by the following: $0.9*\text{fop} \leq \text{f1}p \ldots \text{fnp} \leq 1.1*\text{fop}$. Each of the anti-resonant frequencies f1p . . . fnp of the respective Regions 1 . . . N can be either greater than or less than anti-resonant frequency fop depending on stack thickness. The BAW stack thickness can impact anti-resonant frequency. Generally, a thicker piezoelectric layer in the stack can result in a lower anti-resonant frequency and a thinner piezoelectric layer in the stack can result in a higher anti-resonant frequency. The different thickness in the different regions of the upper material stack 111 of the BAW device 110 can be at least partly due to different thicknesses of a piezoelectric layer. Thicker metal in the BAW stack can add parasitic capacitance in parallel to the resonator active region. Thicker metal in the BAW stack can reduce anti-resonant frequency. For a recessed frame region, by varying the width and/or the depth of the recessed frame structure (e.g., a silicon dioxide recessed frame structure), anti-resonance frequency can increase within a certain amount or decrease if the recessed frame depth and/or width is significantly greater than the optimum values.

Different anti-resonant frequencies can alternatively or additionally result from one or more of different piezoelectric materials in different regions of a BAW resonator, different dopants and/or doping concentrations of the piezoelectric layer in different regions of a BAW resonator, or different c-axis orientations of piezoelectric material in different regions of a BAW resonator. A plurality of anti-resonant frequencies can be achieved by applying one or more of these features to an upper material stack with a structure similar to any of the upper material stacks disclosed herein. One or more layers on a side of the piezoelectric layer of a BAW device facing an acoustic reflector, such as an air cavity or a solid acoustic mirror, can at least contribute to the BAW device having a plurality of anti-resonant frequencies.

A bulk acoustic wave resonator with a plurality of anti-resonant frequencies can be arranged as a series resonator in a ladder filter to contribute to an upper edge of a passband of a band pass filter. In an embodiment, a ladder filter can include a shunt resonator with a plurality of resonant frequencies and a series resonator with a plurality of anti-resonant frequencies.

Notch filters can include a bulk acoustic wave resonator with a plurality of resonances. For example, a notch filter can include an inductor-capacitor low pass filter and a shunt bulk acoustic wave resonator with a plurality of resonant frequencies. As another example, a notch filter can include an inductor-capacitor high pass filter and a bulk acoustic wave resonator with a plurality of anti-resonant frequencies.

Figure 12A:
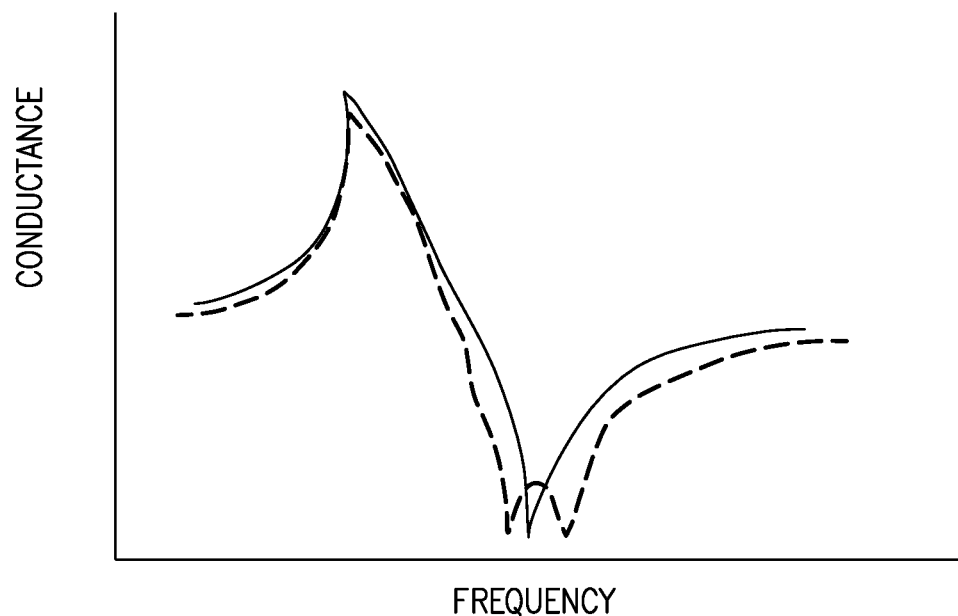
FIG. 12A is a graph of conductance of a BAW resonator with a plurality of anti-resonant frequencies.

FIG. 12A is a graph of a conductance of a BAW resonator with a plurality of anti-resonant frequencies. As shown by the dashed line, a BAW resonator can have two anti-resonant frequencies. In comparison, the solid line corresponds to a similar BAW resonator with a single resonant frequency. As shown in FIG. 12A, the dashed line has two troughs at anti-resonant frequencies. The two anti-resonant frequencies are distinct from each other. A difference between the two anti-resonant frequencies can be at least 1 MHz in certain instances. In some instances, a difference between the two anti-resonant frequencies can be at least 5 MHz. A second anti-resonant frequency can be in a range from 0.9 to 1.1 times a first anti-resonant frequency. A lower of the anti-resonant frequencies can be between a higher of the anti-resonant frequencies and a band edge of a passband of an acoustic wave filter that includes a bulk acoustic wave resonator with two anti-resonant frequencies. The anti-resonant frequencies can be created by different thicknesses of piezoelectric material in different regions of a bulk acoustic wave resonator, for example.

In certain applications, a BAW device can include a recessed frame region having a layer in the BAW stack that is significantly thinner than in the active region. A resonant frequency associated with the recessed frame region can be shifted much higher than a resonant frequency associated with the main acoustically active region, and an anti-resonant frequency associated with the recessed frame region can be relatively close to the anti-resonant frequency of the main acoustically active region. Such a BAW device can have two anti-resonant frequencies and a single resonant frequency that impact a passband of the filter that includes the BAW device. In some applications, a BAW device with different piezoelectric layer thicknesses and similar or the same mass loading in the two different region can have two anti-resonant frequencies and a single resonant frequency that impact a passband of the filter that includes the BAW device.

Figure 12B:
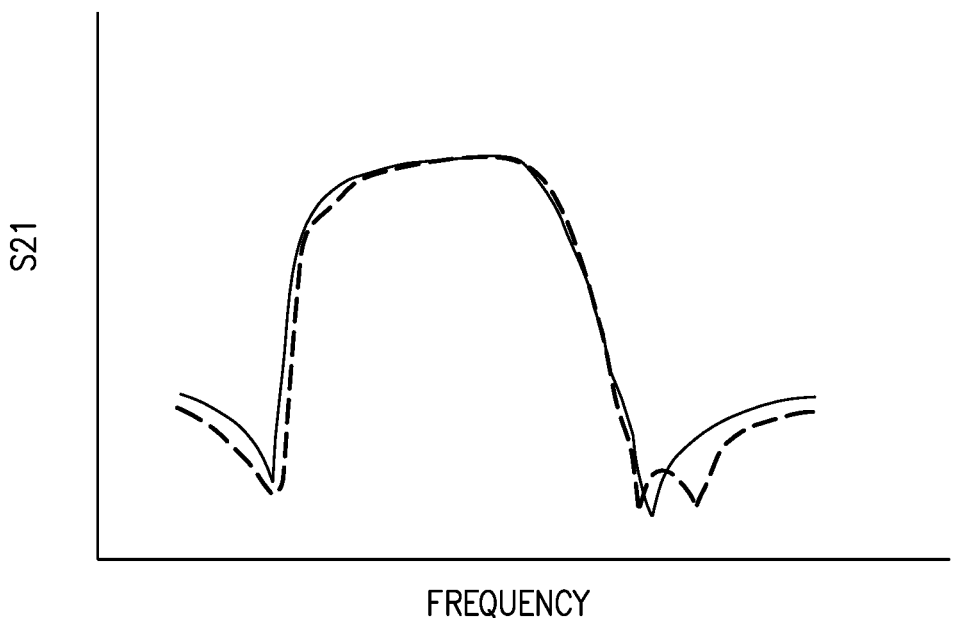
FIG. 12B is a graph of a frequency response of a filter that includes a series BAW resonator with a plurality of anti-resonant frequencies.

FIG. 12B is a graph of a frequency response of a filter that includes a series BAW resonator with a plurality of anti-resonant frequencies. The bulk acoustic wave resonator corresponding to this graph is arranged as a series resonator. The two notches in the frequency response shown in FIG. 12B are at the two anti-resonant frequencies shown in FIG. 12A. The anti-resonant frequencies of the series bulk acoustic wave resonator can both impact the passband of a band pass filter that includes a series bulk acoustic wave resonator. The lowest frequency series bulk acoustic wave resonator can have the largest contribution to edge steepness for an upper edge of a passband of a band pass filter.

Bulk acoustic wave devices disclosed herein can be implemented in a variety of different filter topologies. Example filter topologies include without limitation, ladder filters, lattice filters, hybrid ladder lattice filters, notch filters where a notch is created by the resonant frequency of a shunt resonator, hybrid acoustic and non-acoustic inductor-capacitor filters, and the like. Some such filters can be band pass filters. In some other applications, such filters include band stop filters. In some instances, bulk acoustic wave devices disclosed herein can be implemented in filters with one or more other types of resonators and/or with passive impedance elements, such as one or more inductors and/or one or more capacitors. Some example filter topologies will now be discussed with reference to FIGS. 13 to 15. Any suitable combination of features of the filter topologies of FIGS. 13 to 15 can be implemented together with each other and/or with other filter topologies.

Figure 13:
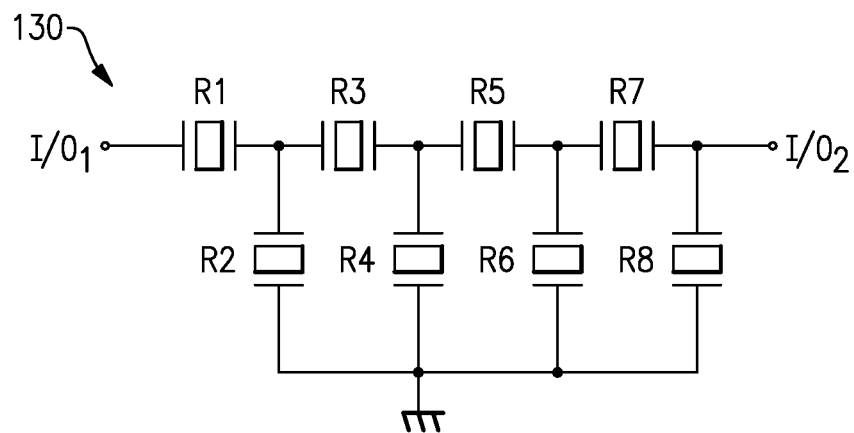
FIG. 13 is a schematic diagram of a ladder filter that includes a bulk acoustic wave resonator according to an embodiment.

FIG. 13 is a schematic diagram of a ladder filter 130 that includes a bulk acoustic wave resonator according to an embodiment. The ladder filter 130 is an example topology that can implement a band pass filter formed from acoustic wave resonators. In a band pass filter with a ladder filter topology, the shunt resonators can have lower resonant frequencies than the series resonators. The ladder filter 130 can be arranged to filter a radio frequency signal. As illustrated, the ladder filter 130 includes series acoustic wave resonators R1 R3, R5, and R7 and shunt acoustic wave resonators R2, R4, R6, and R8 coupled between a first input/output port $I/O_1$ and a second input/output port $I/O_2$.

Any suitable number of series acoustic wave resonators can be in included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

One or more of the acoustic wave resonators of the ladder filter 130 can include a bulk acoustic wave filter according to an embodiment. For example, one or more of the shunt resonators can be a bulk acoustic wave resonator with a plurality of resonant frequencies. Alternatively or additionally, one or more of the series resonators can be a bulk acoustic wave resonator with a plurality of anti-resonant frequencies.

Figure 14:
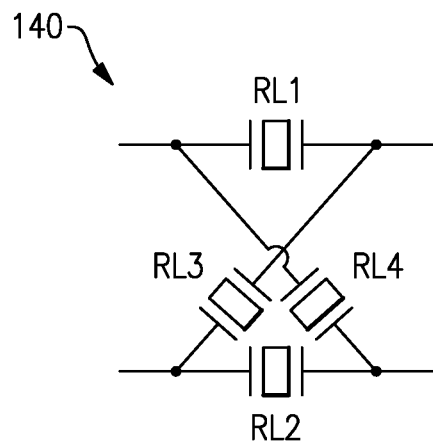
FIG. 14 is a schematic diagram of a lattice filter that includes a bulk acoustic wave resonator according to an embodiment.

FIG. 14 is a schematic diagram of a lattice filter 140 that includes a bulk acoustic wave resonator according to an embodiment. The lattice filter 140 is an example topology that can form a band pass filter from acoustic wave resonators. The lattice filter 140 can be arranged to filter an RF signal. As illustrated, the lattice filter 140 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 140 has a balanced input and a balanced output. One or more of the illustrated acoustic wave resonators RL1 to RL4 can be a bulk acoustic wave resonator in accordance with any suitable principles and advantages disclosed herein.

Figure 15:
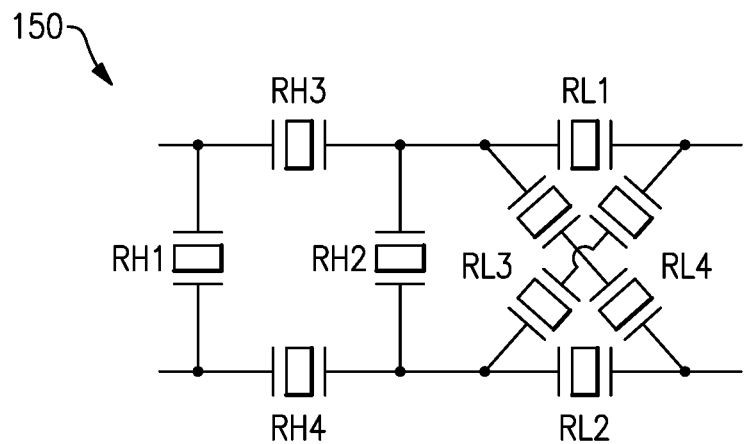
FIG. 15 is a schematic diagram of a hybrid ladder lattice filter that includes a bulk acoustic wave resonator according to an embodiment.

FIG. 15 is a schematic diagram of a hybrid ladder and lattice filter 150 that includes a bulk acoustic wave resonator according to an embodiment. The illustrated hybrid ladder and lattice filter 150 includes series acoustic resonators RL1, RL2, RH3, and RH4 and shunt acoustic resonators RL3, RL4, RH1, and RH2. The hybrid ladder and lattice filter 150 includes one or more bulk acoustic wave resonators in accordance with any suitable principles and advantages disclosed herein. One or more of the shunt resonators RL3, RL4, RH1, and RH2 can be a bulk acoustic wave resonator with a plurality of resonant frequencies according to an embodiment. Alternatively or additionally, one or more of the series resonators RL1, RL2, RH3, and RH4 can be a bulk acoustic wave resonator with a plurality of anti-resonant frequencies according to an embodiment.

According to certain applications, a bulk acoustic wave resonator in accordance with any suitable principles and advantages disclosed herein can be included in filter that also includes one or more inductors and one or more capacitors.

One or more bulk acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more BAW resonators disclosed herein. FR1 can be from 410 megahertz (MHz) to 7.125 gigahertz (GHz), for example, as specified in a current 5G NR specification. One or more bulk acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio—Dual Connectivity (ENDC) application. One or more bulk acoustic wave resonators in accordance with any suitable principles and advantages disclosed herein can be included in an acoustic wave filter for high frequency bands, such as frequency bands above 3 gigahertz (GHz) and/or frequency bands above 5 GHz within FR1. A filter with a bulk acoustic wave resonator disclosed herein can be used for a 5G NR band with a relatively wide passband.

The bulk acoustic wave resonators disclosed herein can be implemented in a standalone filter and/or in a filter in any suitable multiplexer. Such filters can be any suitable topology, such as any filter topology of FIGS. 13 to 15. The filter can be a band pass filter arranged to filter a 4G LTE band and/or 5G NR band. Examples of a standalone filter and multiplexers will be discussed with reference to FIGS. 16A to 16E. Any suitable principles and advantages of these filters and/or multiplexers can be implemented together with each other.

Figure 16A:
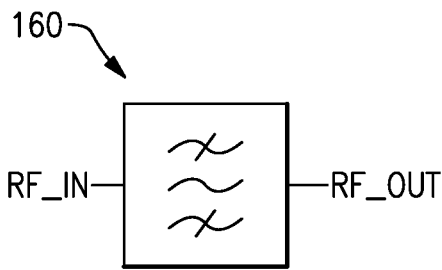
FIG. 16A is a schematic diagram of an acoustic wave filter.

FIG. 16A is schematic diagram of an acoustic wave filter 160. The acoustic wave filter 160 is a band pass filter. The acoustic wave filter 160 is arranged to filter a radio frequency signal. The acoustic wave filter 160 includes one or more acoustic wave devices coupled between a first input/output port RF_IN and a second input/output port RF_OUT. The acoustic wave filter 160 includes a bulk acoustic wave resonator according to an embodiment.

Figure 16B:
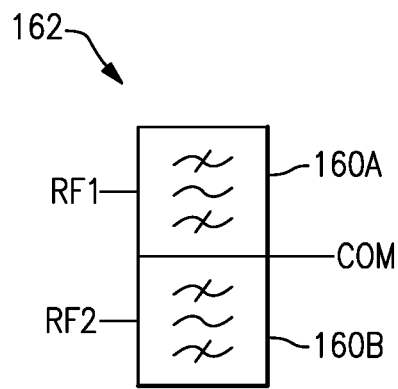
FIG. 16B is a schematic diagram of a duplexer.

FIG. 16B is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein.

The second filter 160B can be any suitable filter arranged to filter a second radio frequency signal. The second filter 160B can be, for example, an acoustic wave filter, an acoustic wave filter that includes a bulk acoustic wave resonator with a plurality of resonant frequencies, an acoustic wave filter that includes a bulk acoustic wave resonator with a plurality of anti-resonant frequencies, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of bulk acoustic wave devices in accordance with any suitable principles and advantages disclosed herein.

Figure 16C:
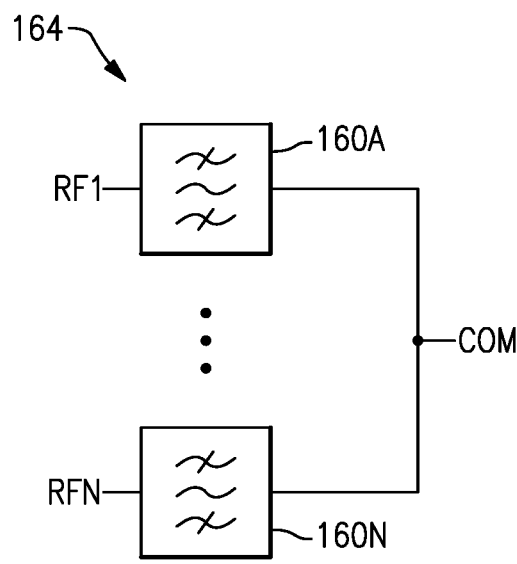
FIG. 16C is a schematic diagram of a multiplexer with hard multiplexing.

FIG. 16C is a schematic diagram of a multiplexer 164 that includes an acoustic wave filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein. The other filter(s) of the multiplexer 164 can include one or more acoustic wave filters, one or more acoustic wave filters that include a bulk acoustic wave resonator in accordance with any suitable principles and advantages disclosed herein, one or more LC filters, one or more hybrid acoustic wave LC filters, the like, or any suitable combination thereof.

Figure 16D:
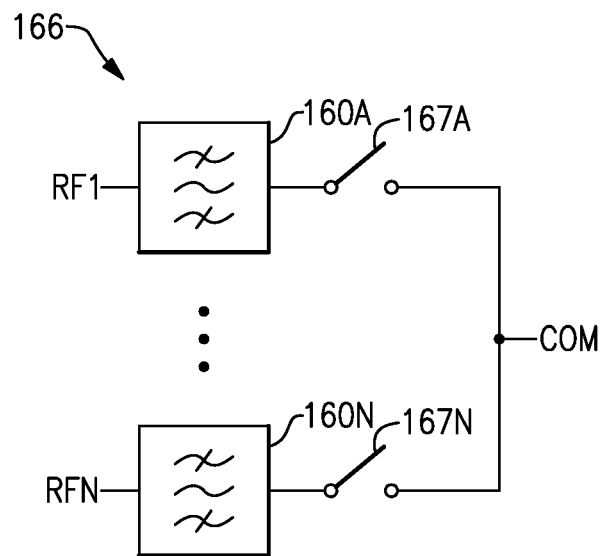
FIG. 16D is a schematic diagram of a multiplexer with switched multiplexing.

FIG. 16D is a schematic diagram of a multiplexer 166 that includes an acoustic wave filter according to an embodiment. The multiplexer 166 is like the multiplexer 164 of FIG. 16C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filters 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 16E:
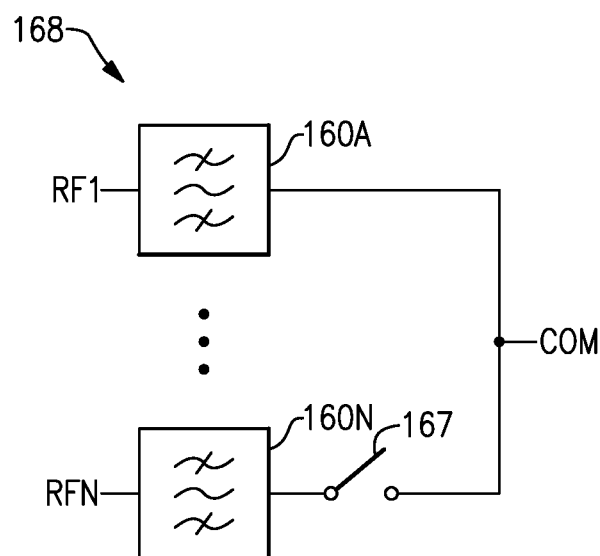
FIG. 16E is a schematic diagram of a multiplexer with a combination of hard multiplexing and switched multiplexing.

FIG. 16E is a schematic diagram of a multiplexer 168 that includes an acoustic wave filter according to an embodiment. The multiplexer 168 illustrates that a multiplexer can include any suitable combination of hard multiplexed and switched multiplexed filters. One or more bulk acoustic wave devices in accordance with any suitable principles and advantages disclosed herein can be included in a filter that is hard multiplexed to the common node of a multiplexer. Alternatively or additionally, one or more bulk acoustic wave devices in accordance with any suitable principles and advantages disclosed herein can be included in a filter that is switch multiplexed to the common node of a multiplexer.

The bulk acoustic wave devices disclosed herein can be implemented in a variety of packaged modules. Some example packaged modules will now be disclosed in which any suitable principles and advantages of the acoustic wave devices, acoustic wave filters, or multiplexers disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 17 to 21 are schematic block diagrams of illustrative packaged modules according to certain embodiments. Any suitable combination of features of these packaged modules can be implemented with each other. While duplexers are illustrated in the example packaged modules of FIGS. 18, 19, and 21, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 17:
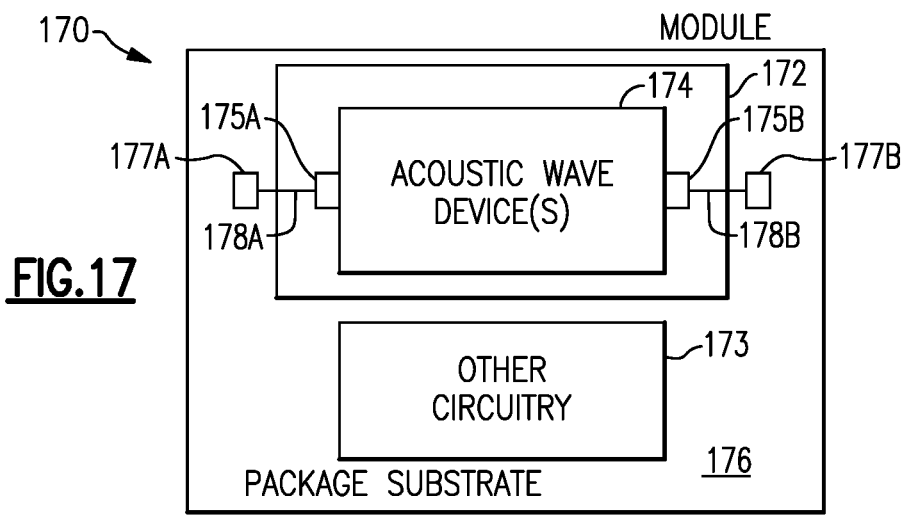
FIG. 17 is a schematic diagram of a radio frequency module that includes an acoustic wave filter according to an embodiment.

FIG. 17 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include one or more bulk acoustic wave devices in accordance with any suitable combination of features of the acoustic wave filters disclosed herein. The acoustic wave component 172 can include an acoustic wave filter that includes a plurality of bulk acoustic wave resonators, for example.

The acoustic wave component 172 shown in FIG. 17 includes one or more acoustic wave devices 174 and terminals 175A and 175B. The one or more acoustic wave devices 174 include at least one bulk acoustic wave device implemented in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 18. The package substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

Figure 18:
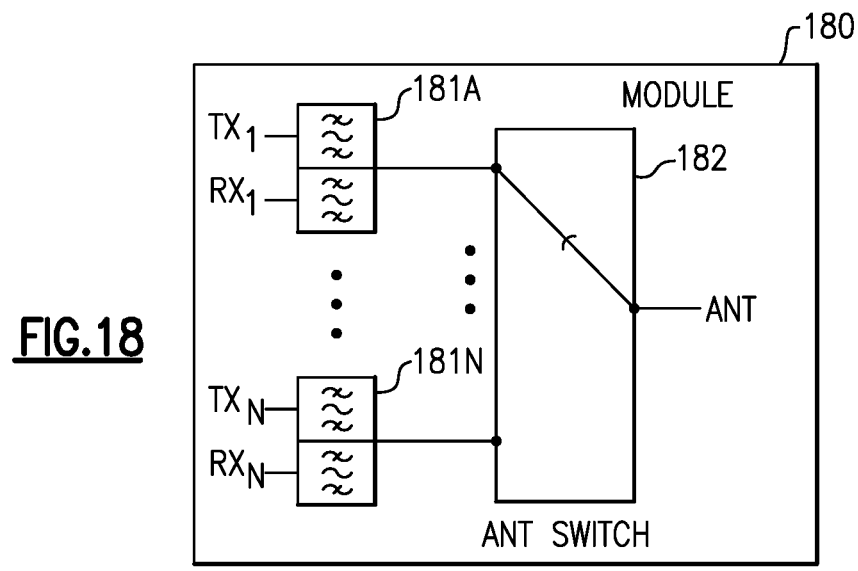
FIG. 18 is a schematic block diagram of a module that includes an antenna switch and duplexers according to an embodiment.

FIG. 18 is a schematic block diagram of a module 180 that includes duplexers 181A to 181N and an antenna switch 182. One or more filters of the duplexers 181A to 181N can include a bulk acoustic wave device in accordance with any suitable principles and advantages disclosed herein. Any suitable number of duplexers 181A to 181N can be implemented. The antenna switch 182 can have a number of throws corresponding to the number of duplexers 181A to 181N. The antenna switch 182 can include one or more additional throws coupled to one or more filters external to the module 180 and/or coupled to other circuitry. The antenna switch 182 can electrically couple a selected duplexer to an antenna port of the module 180.

Figure 19:
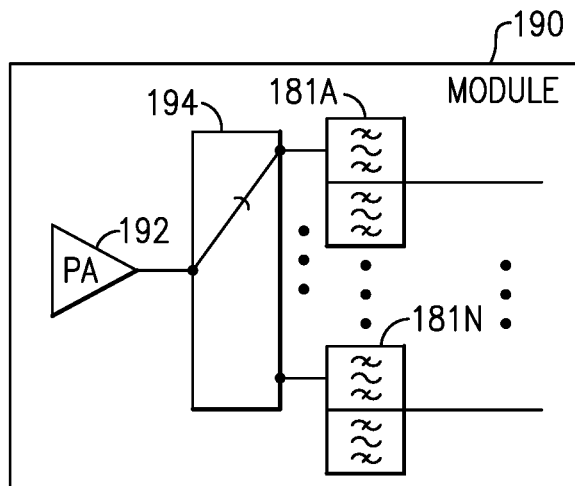
FIG. 19 is a schematic block diagram of a module that includes a power amplifier, a radio frequency switch, and duplexers according to an embodiment.

FIG. 19 is a schematic block diagram of a module 190 that includes a power amplifier 192, a radio frequency switch 194, and duplexers 181A to 181N according to an embodiment. The power amplifier 192 can amplify a radio frequency signal. The radio frequency switch 194 can be a multi-throw radio frequency switch. The radio frequency switch 194 can electrically couple an output of the power amplifier 192 to a selected transmit filter of the duplexers 181A to 181N. One or more filters of the duplexers 181A to 181N can include a bulk acoustic wave device in accordance with any suitable principles and advantages disclosed herein. Any suitable number of duplexers 181A to 181N can be implemented.

Figure 20:
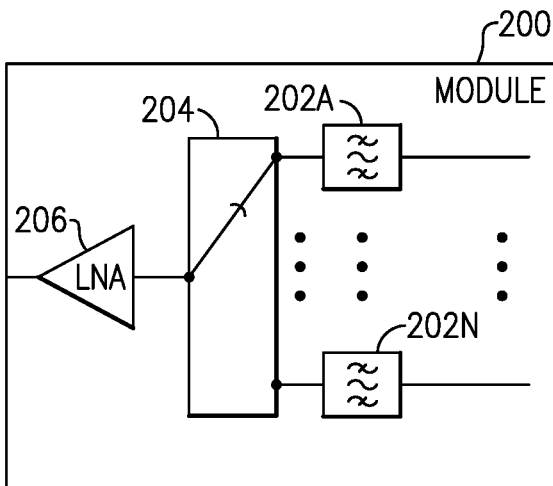
FIG. 20 is a schematic block diagram of a module that includes a low noise amplifier, a radio frequency switch, and filters according to an embodiment.

FIG. 20 is a schematic block diagram of a module 200 that includes filters 202A to 202N, a radio frequency switch 204, and a low noise amplifier 206 according to an embodiment. One or more filters of the filters 202A to 202N can include any suitable number of bulk acoustic wave devices in accordance with any suitable principles and advantages disclosed herein. Any suitable number of filters 202A to 202N can be implemented. The illustrated filters 202A to 202N are receive filters. In some embodiments (not illustrated), one or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments (not illustrated), a plurality of low noise amplifiers can be implemented. The module 200 can include diversity receive features in certain applications.

Figure 21:
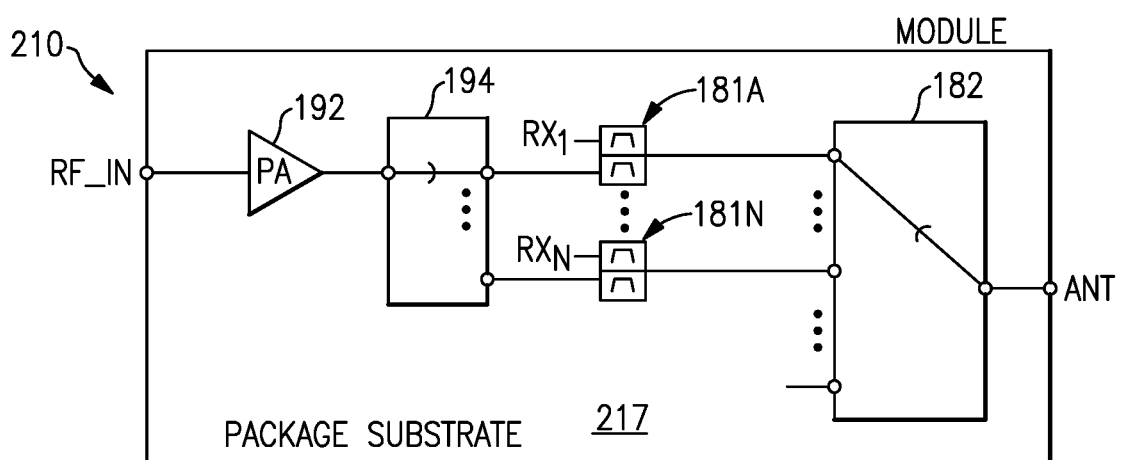
FIG. 21 is a schematic diagram of a radio frequency module that includes an acoustic wave filter according to an embodiment.

FIG. 21 is a schematic diagram of a radio frequency module 210 that includes an acoustic wave filter according to an embodiment. As illustrated, the radio frequency module 210 includes duplexers 181A to 181N, a power amplifier 192, a select switch 194, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 21 and/or additional elements. The radio frequency module 210 may include any one of the acoustic wave filters that include at least one bulk acoustic wave resonator in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include a bulk acoustic wave device in accordance with any suitable principles and advantages disclosed herein. Similarly, one or more of the receive filters can include a bulk acoustic wave device in accordance with any suitable principles and advantages disclosed herein. Although FIG. 21 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 192 can amplify a radio frequency signal. The illustrated switch 194 is a multi-throw radio frequency switch. The switch 194 can electrically couple an output of the power amplifier 192 to a selected transmit filter of the transmit filters of the duplexers 181A to 181N. In some instances, the switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 22:
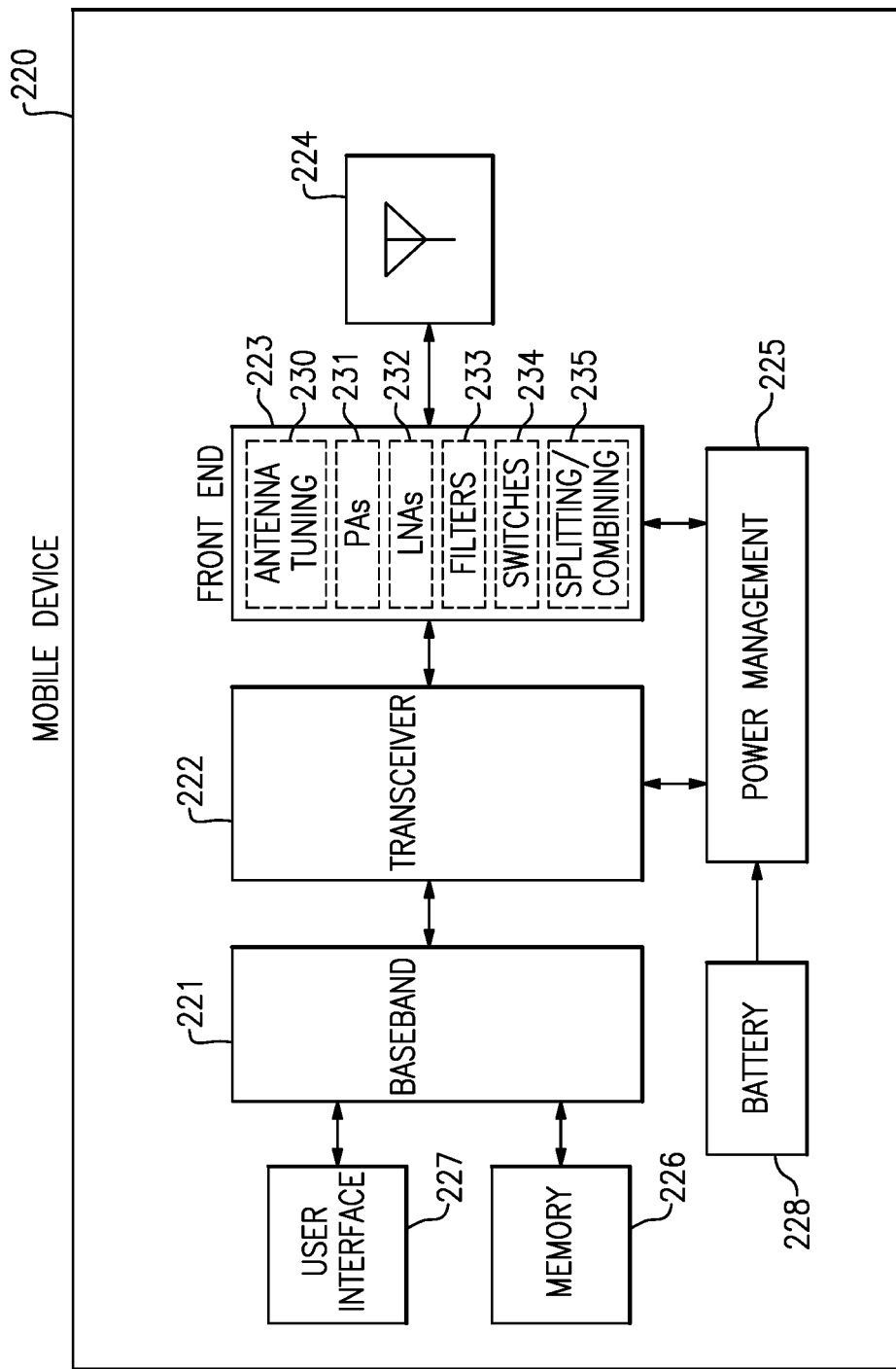
FIG. 22 is a schematic block diagram of a wireless communication device that includes a filter according to an embodiment.

The bulk acoustic wave devices disclosed herein can be implemented in wireless communication devices. FIG. 22 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 22 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters that include any suitable number of bulk acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (110), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 22, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 22, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter configured to filter a radio frequency signal, the acoustic wave filter comprising:
   a plurality of shunt acoustic wave resonators including a bulk acoustic wave resonator, the bulk acoustic wave resonator having at least a first resonant frequency corresponding to a first region and a second resonant frequency corresponding to a second region, the second resonant frequency being different than the first resonant frequency, the bulk acoustic wave resonator including a raised frame structure in a raised frame region that surrounds the first region and the second region in plan view, and the bulk acoustic wave resonator having a first peak conductance at the first resonant frequency and a second peak conductance at the second resonant frequency; and
   a plurality of series acoustic wave resonators, the plurality of series acoustic wave resonators and the plurality of shunt acoustic wave resonators together configured to filter the radio frequency signal, the acoustic wave filter having a passband, and the first resonant frequency and the second resonant frequency both impacting the passband.

2. The acoustic wave filter of claim 1 wherein the second resonant frequency is in a range from 0.9 times the first resonant frequency to 1.1 times the first resonant frequency.

3. The acoustic wave filter of claim 1 wherein the acoustic wave filter is a band pass filter, and the second resonant frequency is between the first resonant frequency and an edge of the passband.

4. The acoustic wave filter of claim 1 wherein the second region surrounds the first region in plan view.

5. The acoustic wave filter of claim 4 wherein the bulk acoustic wave resonator has more mass loading in the first region than in the second region.

6. The acoustic wave filter of claim 4 wherein the bulk acoustic wave resonator has more mass loading in the second region than in the first region.

7. The acoustic wave filter of claim 1 wherein the bulk acoustic wave resonator has a third resonant frequency.

8. The acoustic wave filter of claim 1 wherein the bulk acoustic wave resonator includes a single piezoelectric layer.

9. The acoustic wave filter of claim 1 wherein a difference between the first resonant frequency and the second resonant frequency is at least 1 megahertz.

10. The acoustic wave filter of claim 1 wherein the plurality of shunt acoustic wave resonators includes a second bulk acoustic wave resonator having a plurality of resonant frequencies.

11. The acoustic wave filter of claim 1 wherein the plurality of series acoustic wave resonators includes a series bulk acoustic wave resonator having a plurality of anti-resonant frequencies.

12. The acoustic wave filter of claim 1 wherein the bulk acoustic wave resonator has a single anti-resonant frequency that impacts the passband.

13. A radio frequency module comprising:
an acoustic wave filter including a shunt bulk acoustic wave resonator having at least a first resonant frequency corresponding to a first region and a second resonant frequency corresponding to a second region, the second resonant frequency being different than the first resonant frequency, the acoustic wave filter having a passband, the first resonant frequency and the second resonant frequency both impacting the passband, the shunt bulk acoustic wave resonator including a raised frame structure in a raised frame region that surrounds the first region and the second region in plan view, and the shunt bulk acoustic wave resonator having a first peak conductance at the first resonant frequency and a second peak conductance at the second resonant frequency; and
a radio frequency circuit element coupled to the acoustic wave filter, the acoustic wave filter and the radio frequency circuit element being enclosed within a common package.

14. The radio frequency module of claim 13 wherein the radio frequency circuit element is a radio frequency amplifier arranged to amplify a radio frequency signal.

15. The radio frequency module of claim 13 wherein the radio frequency circuit element is a switch configured to selectively couple the acoustic wave filter to an antenna port of the radio frequency module.

16. A bulk acoustic wave resonator comprising:
a first electrode;
a second electrode;
a piezoelectric layer positioned between the first electrode and the second electrode, the bulk acoustic wave resonator having at least a first resonant frequency corresponding to a first region and a second resonant frequency corresponding to a second region, the bulk acoustic wave resonator having different mass loading in the first region than in the second region, the second resonant frequency being different than the first resonant frequency, and the second resonant frequency being in a range from 0.9 times the first resonant frequency to 1.1 times the first resonant frequency, and the bulk acoustic wave resonator having a first peak conductance at the first resonant frequency and a second peak conductance at the second resonant frequency; and
a raised frame structure in a raised frame region, the raised frame region surrounding the first region and the second region in plan view.

17. The bulk acoustic wave resonator of claim 16 wherein the second region surrounds the first region in plan view, and the first region includes a central part of an active region of the bulk acoustic wave resonator.

18. The bulk acoustic wave resonator of claim 16 wherein the bulk acoustic wave resonator has a taller stack in the second region than in the first region.

19. The bulk acoustic wave resonator of claim 16 wherein the bulk acoustic wave resonator has a third resonant frequency corresponding to a third region.

20. The bulk acoustic wave resonator of claim 16 wherein the bulk acoustic wave resonator is a film bulk acoustic wave resonator.

* * * * *